(12) United States Patent
Rajaee et al.

(10) Patent No.: US 10,756,751 B2
(45) Date of Patent: Aug. 25, 2020

(54) PROGRAMMABLE RECEIVERS INCLUDING A DELTA-SIGMA MODULATOR

(71) Applicant: Microchip Technology Incorporated, Chandler, AZ (US)

(72) Inventors: Omid Rajaee, San Diego, CA (US); Rahim Bagheri, Poway, CA (US); Saeed Pourbagheri, Poway, CA (US); Mohammad Mehrjoo, San Diego, CA (US); Mahdi Bagheri, Carlsbad, CA (US); Edwin Chiem, San Diego, CA (US); Jun Wang, San Diego, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 16/176,714

(22) Filed: Oct. 31, 2018

(65) Prior Publication Data

US 2019/0348996 A1 Nov. 14, 2019

Related U.S. Application Data

(60) Provisional application No. 62/669,131, filed on May 9, 2018.

(51) Int. Cl.
*H03M 3/00* (2006.01)
*H03H 19/00* (2006.01)
*H04B 1/38* (2015.01)

(52) U.S. Cl.
CPC .......... *H03M 3/452* (2013.01); *H03H 19/004* (2013.01); *H03M 3/422* (2013.01);
(Continued)

(58) Field of Classification Search
None
See application file for complete search history.

(56) References Cited

U.S. PATENT DOCUMENTS 5,828,955 A * 10/1998 Lipowski ............... H03D 3/008
455/324
8,436,757 B2 5/2013 San et al.
(Continued)

FOREIGN PATENT DOCUMENTS

WO 2012/099723 A1 7/2012

OTHER PUBLICATIONS

Jantzi et al. ,Quadrature Bandpass Delta-Sigma Modulation for Digital Radio, IEEE Journal of Solid-State Circuits, vol. 32, No. 12, Dec. 1997 (Year: 1997).*

(Continued)

*Primary Examiner* — Howard Williams
(74) *Attorney, Agent, or Firm* — TraskBritt

(57) ABSTRACT

Various embodiments relate to an analog-to-digital converter (ADC). The ADC may include a first channel including a first delta-sigma loop filter and a second channel including a second delta-sigma loop filter. Each of the first delta-sigma loop filter and the second delta-sigma loop filter may include a first integrator and a quantizer having an input coupled to an output of the first integrator. Each of the first delta-sigma loop filter and the second delta-sigma loop filter may also include a first summing node having an output coupled to an input of the first integrator, and a feedforward path from an input of the delta sigma loop filter to a first input of the first summing node. Further, each of the first delta-sigma loop filter and the second delta-sigma loop filter may include a first feedback path from an output of the quantizer to a second input of the first summing node.

22 Claims, 13 Drawing Sheets

(52) U.S. Cl.
CPC .............. *H03M 3/43* (2013.01); *H03M 3/454* (2013.01); *H03M 3/464* (2013.01); *H04B 1/38* (2013.01)

(56) References Cited

U.S. PATENT DOCUMENTS

| | | | |
|---|---|---|---|
| 8,779,957 | B2 | 7/2014 | Rajaee et al. |
| 9,564,916 | B2 | 2/2017 | Bandyopadhyay |
| 9,720,875 | B2 | 8/2017 | De et al. |
| 2005/0191980 | A1* | 9/2005 | Oliaei .................... H03M 3/40 455/205 |
| 2006/0284751 | A1* | 12/2006 | San ........................ H03M 3/34 341/143 |
| 2009/0051421 | A1 | 2/2009 | Mathe |
| 2010/0019944 | A1* | 1/2010 | Oliaei ................... H03M 3/392 341/143 |
| 2011/0316729 | A1* | 12/2011 | San ....................... H03M 3/368 341/110 |
| 2012/0163434 | A1 | 6/2012 | Kim et al. |
| 2013/0083868 | A1 | 4/2013 | Onody |
| 2013/0194116 | A1 | 8/2013 | Oliaei et al. |
| 2014/0368365 | A1 | 12/2014 | Quipuempoix et al. |

OTHER PUBLICATIONS

Yamamoto et al. A Delta-Sigma Modulator With a Widely Programmable Center Frequency and 82-dB Peak SNDR, IEEE Journal of Solid-State Circuits, vol. 43, No. 8, Aug. 2008 (Year: 2008).*
International Search Report for International Application No. PCT/US2019/029217, dated Sep. 11, 2019, 5 pages.
International Written Opinion for International Application No. PCT/US2019/029217, dated Sep. 11, 2019, 16 pages.
Jung S-W et al. "Design and Implementation of a Fourth-Order Quadrature Band-Pass Delta-Sigma Modulator for Low-IF Receivers", IEICE Transactions of Fundamentals of Electronics, Communications and Computer Sciences, Engineering Sciences Society, Tokyo, JP, vol. E83-A, No. 12, Dec. 1, 2000, pp. 2649-2656, XP001036421.
Yang, Xu et al. "A Flexible Continuous-Time ?S ADC With Programmable Bandwidth Supporting Low-Pass and Complex Bandpass Architectures", IEEE Transactions on Very Large Scale Integration (VLSI) Systems, vol. 25, No. 3, Oct. 4, 2016, pp. 872-880, XP55461392.

* cited by examiner (State Of The Art)

(State Of The Art)

(State Of The Art)

*(State Of The Art)*

PROGRAMMABLE RECEIVERS INCLUDING A DELTA-SIGMA MODULATOR

CROSS-REFERENCE TO RELATED APPLICATION

A claim for benefit of priority to the May 9, 2018 filing date of the U.S. Patent Provisional Application No. 62/669,131, titled "DELTA-SIGMA LOOP FILTER WITH INPUT FEEDFORWARD AND RELATED SYSTEMS, METHODS AND DEVICES" (the '131 Provisional Application), is hereby made pursuant to 35 U.S.C. § 119(e). The entire disclosure of the '131 Provisional Application is hereby incorporated herein.

TECHNICAL FIELD

The present disclosure relates generally to programmable receivers, and more specifically, to programmable receivers including a delta-sigma modulator.

BACKGROUND

Analog-to-digital converters (ADCs) may be used in wireless communication to convert an analog radio frequency (RF) signal into a digital signal. An ADC may include an RF front-end that includes RF filters that reject unwanted frequencies and pass through wanted frequencies (i.e., the "pass band"), and, generally, allow compatibility with one or more communication protocols (e.g., Bluetooth, Bluetooth Low Energy (BLE), Wireless, Near Field Communication (NFC), etc.).

Delta-sigma modulation is a technique for encoding an analog signal (such as analog RF signals) into a digital signal. Unlike quantizers used in conventional ADCs that encode the absolute value of a signal (which introduces quantization error noise into an encoded digital signal), delta-sigma modulation encodes the change in the signal (i.e., its delta). By way of example, a conventional delta-sigma ADC may encode an analog signal using high-frequency delta-sigma modulation and then apply a filter to form a higher resolution, but lower sample-frequency, digital output. Delta-sigma modulation is particularly useful for communication systems because it may achieve higher transmission efficiency by transmitting only the changes in value between consecutive samples, rather than the actual sample values.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1A:
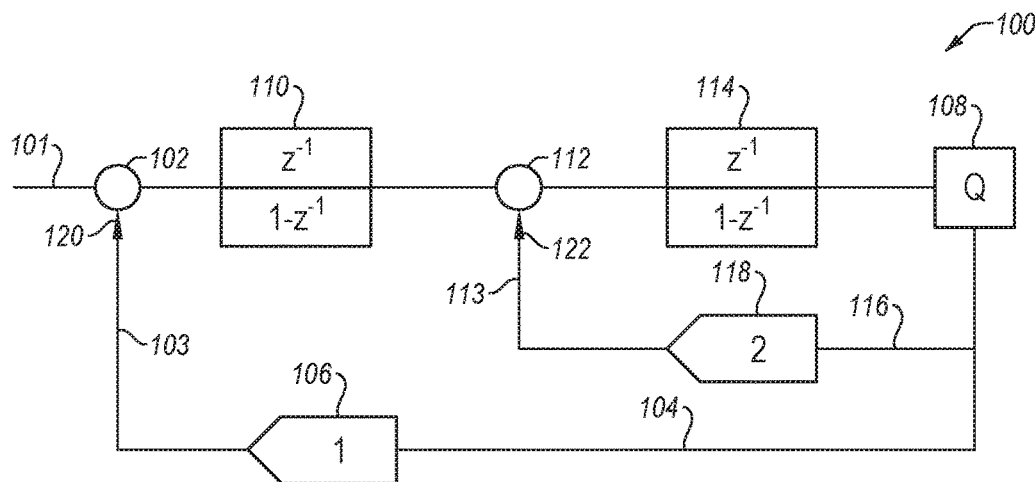
FIG. 1A depicts an example $2^{nd}$ order feedback delta-sigma loop filter.

Various embodiments disclosed herein relate to programmable receivers. More specifically, some embodiments may relate to receivers that include a programmable modulator including at least one delta-sigma loop filter. In these embodiments, the receiver may be configurable to switch between a zero-intermediate frequency (Zero-IF) operation and low-intermediate frequency (Low-IF) operation. Further, in at least one embodiment, a bandwidth center-frequency of a modulator may be programmed via one or more coefficients of one or more coupling paths of a delta-sigma loop filter, which may enable a center frequency of the modulator to be adjusted (e.g., from zero to an intermediate frequency). Further, some embodiments may include a selection unit (e.g., a configurable state machine, a switched capacitor network, and/or logic) that may be configured to set one or more levels of programming for a receiver including a delta-sigma modulator. Moreover, some embodiments relate to a programmable receiver wherein in-phase and quadrature channels of the receiver may be swapped (e.g., prior to receipt of in-phase and quadrature signals at an ADC). Further, in some embodiments, a frequency of a local oscillator (LO) signal received at a receiver may be adjusted.

In the following detailed description, reference is made to the accompanying drawings which form a part hereof, and in which is shown by way of illustration specific embodiments in which the disclosure may be practiced. These embodiments are described in sufficient detail to enable those of ordinary skill in the art to practice the disclosure. It should be understood, however, that the detailed description and the specific examples, while indicating examples of embodiments of the disclosure, are given by way of illustration only and not by way of limitation. From this disclosure, various substitutions, modifications, additions rearrangements, or combinations thereof within the scope of the disclosure may be made and will become apparent to those of ordinary skill in the art.

In accordance with common practice, the various features illustrated in the drawings may not be drawn to scale. The illustrations presented herein are not meant to be actual views of any particular apparatus (e.g., device, system, etc.) or method, but are merely representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus or all operations of a particular method.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal for clarity of presentation and description. It should be understood by a person of ordinary skill in the art that the signal may represent a bus of signals, wherein the bus may have a variety of bit widths and the disclosure may be implemented on any number of data signals including a single data signal.

It should be understood that any reference to an element herein using a designation such as "first," "second," and so forth does not limit the quantity or order of those elements, unless such limitation is explicitly stated. Rather, these designations are used herein as a convenient method of distinguishing between two or more elements or instances of an element. Thus, a reference to first and second elements does not mean that only two elements can be employed or that the first element must precede the second element in some manner. Also, unless stated otherwise a set of elements may comprise one or more elements. Likewise, sometimes elements referred to in the singular form may also include one or more instances of the element.

As used herein, "N order" loop filter refers to the number of integrator stages in a loop filter, for example, "$1^{st}$ order," "$2^{nd}$ order," and "$3^{rd}$ order" delta-sigma loop filter refers to a delta-sigma loop filter that has a single integrator stage, two integrator stages, and three integrator stages, respectively.

Examples of delta-sigma loop filters used in conventional ADCs include a feedback delta-sigma loop filter, a feedforward delta-sigma loop filter, and what is termed in this disclosure as an enhanced feedforward delta-sigma loop filter.

FIG. 1A shows a conventional $2^{nd}$ order feedback delta-sigma loop filter 100. Loop filter 100 is configured to receive an input signal 101 at a first summing node 102, where a feedback signal 103 of a first feedback path 104 is subtracted from input signal 101. Feedback signal 103 is an output signal of a primary feedback digital-to-analog converter (DAC) 106, which outputs a reference voltage based on a 'low' or 'high' output of a quantizer 108. An output signal conveyed from first summing node 102 is conveyed to an input of a first loop integrator 110. An output signal of first loop integrator 110 is conveyed to a summing node 112, where a feedback signal 113 of a second feedback path 116 is subtracted from the output signal of first loop integrator 110. Feedback signal 113 is an output signal of a secondary feedback DAC 118, which outputs a reference voltage based on the output of quantizer 108. An output signal of second summing node 112 is conveyed to a second loop integrator 114, and an output signal of second loop integrator 114 is conveyed to quantizer 108. Each of feedback signal 103 and feedback signal 113 are amplified at an input of first summing node 102 and an input of second summing node 112, respectively (e.g., by gain stages 120 and 122). One drawback, known to the inventors of this disclosure, of the feedback delta-sigma loop shown in FIG. 1A is that the loop integrators have more stringent design requirements because gain stages (e.g., gain stages 120 and 122) at the summing nodes 102 and 112 have large swing and linearity (gain) requirements.

Figure 1B:
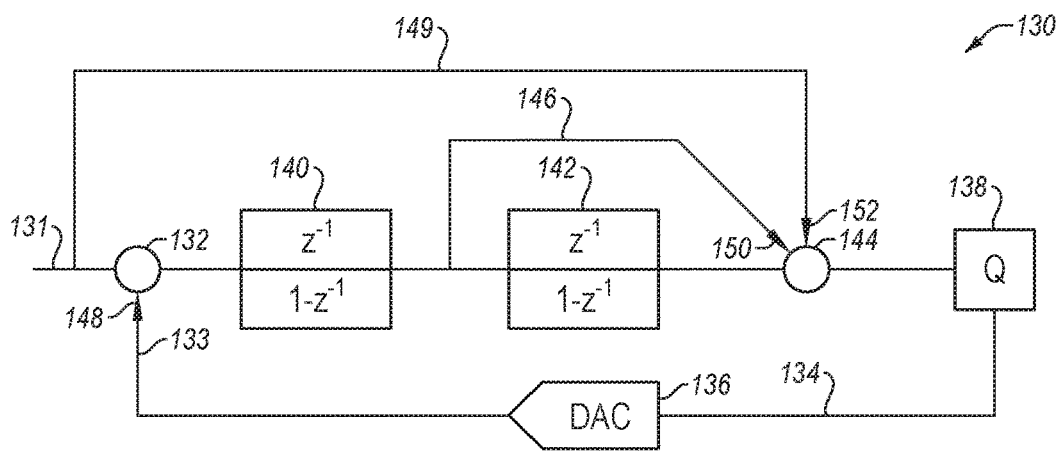
FIG. 1B shows an example $2^{nd}$ order feedforward delta-sigma loop filter.

FIG. 1B shows a conventional $2^{nd}$ order feedforward delta-sigma loop filter 130. Loop filter 130 is configured to receive an input signal 131 at a first summing node 132, where a feedback signal 133 of a feedback path 134 is subtracted from input signal 131. Feedback signal 133 is an output signal of a primary DAC 136, which outputs a reference voltage based on an output of a quantizer 138. An output signal of first summing node 132 is conveyed to a first loop integrator 140, and an output signal of first loop integrator 140 is conveyed to a second loop integrator 142. The output signal of first loop integrator 140 is also conveyed to a second summing node 144 via a feedforward path 146. Input signal 131 is also conveyed to second summing node 144 via a second feedforward path 149. At summing node 144, input signal 131 and an output signal of first loop integrator 140 are subtracted from the output signal of second loop integrator 142. The output signal of second summing node 144 is conveyed to quantizer 138.

Several drawbacks of delta-sigma loop filter 130 shown in FIG. 1B are known to the inventors of this disclosure. First, delta-sigma loop filter 130 includes one more gain stages (e.g., gain stages 150 and/or 152, which may include optical transconductance amplifiers (OTAs)) at the summing nodes as compared to feedback delta-sigma loop filter 100 shown in FIG. 1A. The gain stages at summing nodes 132 and 144 impose some gain and swing requirements on loop integrators 140 and 142. In addition, the design may impose stringent timing requirements for the summing circuit. Finally, there is extra loading (sometimes significant extra loading) at the output of loop integrator 140 and summing node 132.

Figure 1C:
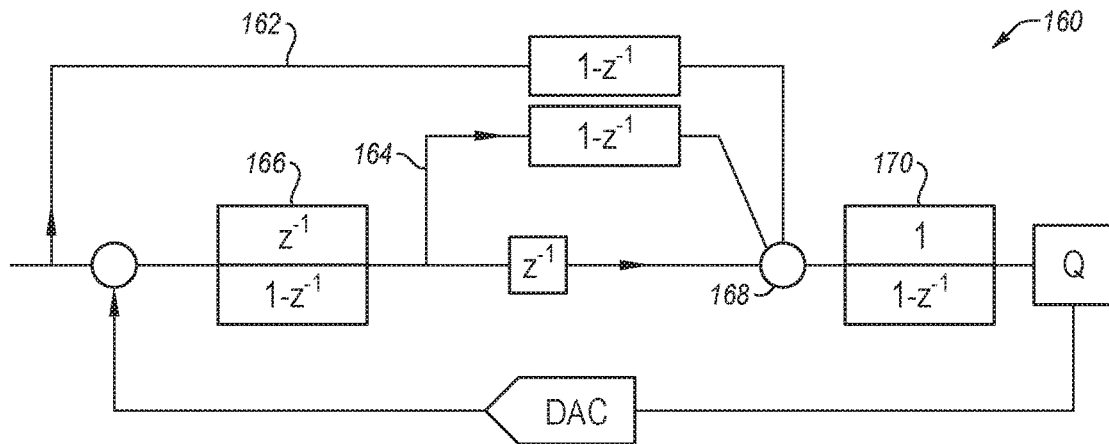
FIG. 1C shows an example $2^{nd}$ order enhanced feedforward delta-sigma loop filter.

FIG. 1C shows a conventional $2^{nd}$ order enhanced feedforward delta-sigma loop filter 160. During operation of loop filter 160, two feedforward paths 162 and 164 are subtracted from an output signal of a first loop integrator 166 (i.e., at a summing node 168), and an output signal of summing node 168 is conveyed to a second loop integrator 170. One drawback known to the inventors of this disclosure with feedforward delta-sigma loop filter 160 is that the settling time at feedforward path 164 may complicate setting up the loop integrators, and thus timing constraints may be impacted.

Various embodiments, as disclosed herein, relate, generally, to ADCs with delta-sigma loop filters that, in addition to other benefits and advantages, may not suffer from some or all of the deficiencies and drawbacks of conventional ADCs with delta-sigma loop filters, such as those shown in FIGS. 1A, 1B, and 1C. In some embodiments, an input-feedforward path and a secondary feedback path may be selected such that a summing node is coupled to an input of a last integrator, instead of being coupled to an input of a quantizer (e.g., see FIG. 1B), and thus a Noise Transfer Function (NTF) and/or a Signal Transfer Function (STF) may not be altered. Notably, an NTF of a $2^{nd}$ order delta-sigma with both zeros at DC (direct current, so no frequency change) may be derived as a discrete time (z-domain) form of $(1-z^{-1})^2$. At DC, $z^{-1}$ may be 1. An STF for a feedback delta-sigma loop, similar to conventional loop filter 130 shown in FIG. 1A, may be z'. In the conventional feedforward systems shown in FIGS. 1B and 1C, the STF may be 1.

Although various embodiments of the disclosure are described as $2^{nd}$ order input-feedforward delta-sigma loop filters or a $3^{rd}$ order input-feedforward delta-sigma loop filters, the principles may be scalable through any order (e.g., 4, 5, 6, etc.). For various $2^{nd}$ order embodiments, the loading on a first integrator may be approximately ⅓ of the conventional feedforward loop filters described above. Further, there is little or no (inconsequential) settling on a critical feedforward path, unlike conventional feedforward delta-sigma loop filter 160 shown in FIG. 1C. Further, a $2^{nd}$ order embodiment may have fewer gain stages (e.g., amplifiers), which may relax design requirements as compared to the conventional loop filters described above. For various $3^{rd}$ order embodiments, fewer gain stages may be required and a total load added at an input of a last integrator and output of the first and second integrators may be less, as compared to conventional feedforward $3^{rd}$ order loop filters.

Some embodiments of the disclosure relate to ADCs and to various input-feed forward delta-sigma loop filters including one or more quadrature integrators. A quadrature integrator may provide more efficient noise shaping (e.g., a 10+dB benefit in Qnoise shaping) compared to feedback zero optimization (in low pass delta-sigma modulators) where the output of a second integrator may be fed back to an input of a first integrator. In both cases, NTF zeros are moved in-band from DC. However, in quadrature delta-sigma ADCs, both zeros are in signal band and in the case of a low pass delta-sigma with zero optimization, one zero may be selectively placed in signal band and one zero may be placed in the image band.

Figure 2:
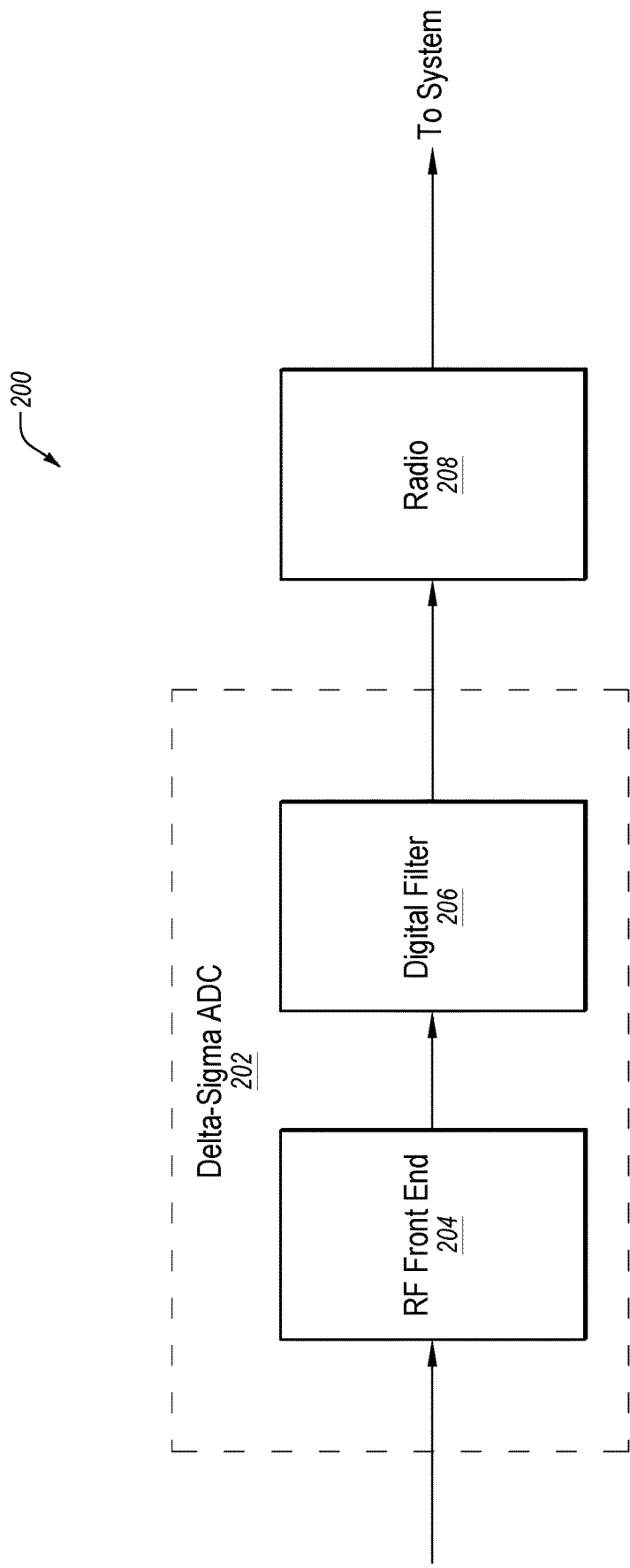
FIG. 2 is a block diagram illustrating an example delta-sigma analog-to-digital converter (ADC), in accordance with various embodiments of the disclosure.

FIG. 2 is a block diagram depicting a device 200 including a delta-sigma ADC 202, in accordance with various embodiments of the disclosure. Delta-sigma ADC 202 includes an RF front-end 204 and a digital filter 206. Delta-sigma ADC, and more specifically, RF front-end 204, may include one or more loop filters and/or modulators disclosed herein. In some embodiments, delta-sigma ADC 202 may be operatively coupled to, or may be part of, a radio 208. For example, delta-sigma ADC 202 may be usable in a receiver, which may be used in, for example, wireless communication, and, in at least one embodiment, ADC 202 may be part of a system-on-chip (SoC) that includes other components.

Discrete transforms that describe how, during operation, discrete time signals may be represented in a complex frequency domain are shown in many of the accompanying figures used when describing embodiments of the disclosure. One of ordinary skill in the art would understand that, while embodiments of this disclosure include the discrete transforms, the discrete transforms do not limit the generality of the architectures described in this disclosure. Moreover, inclusion of a discrete transform is not intended to indicate that operation is required for infringement of any claim disclosed herein.

Figure 3:
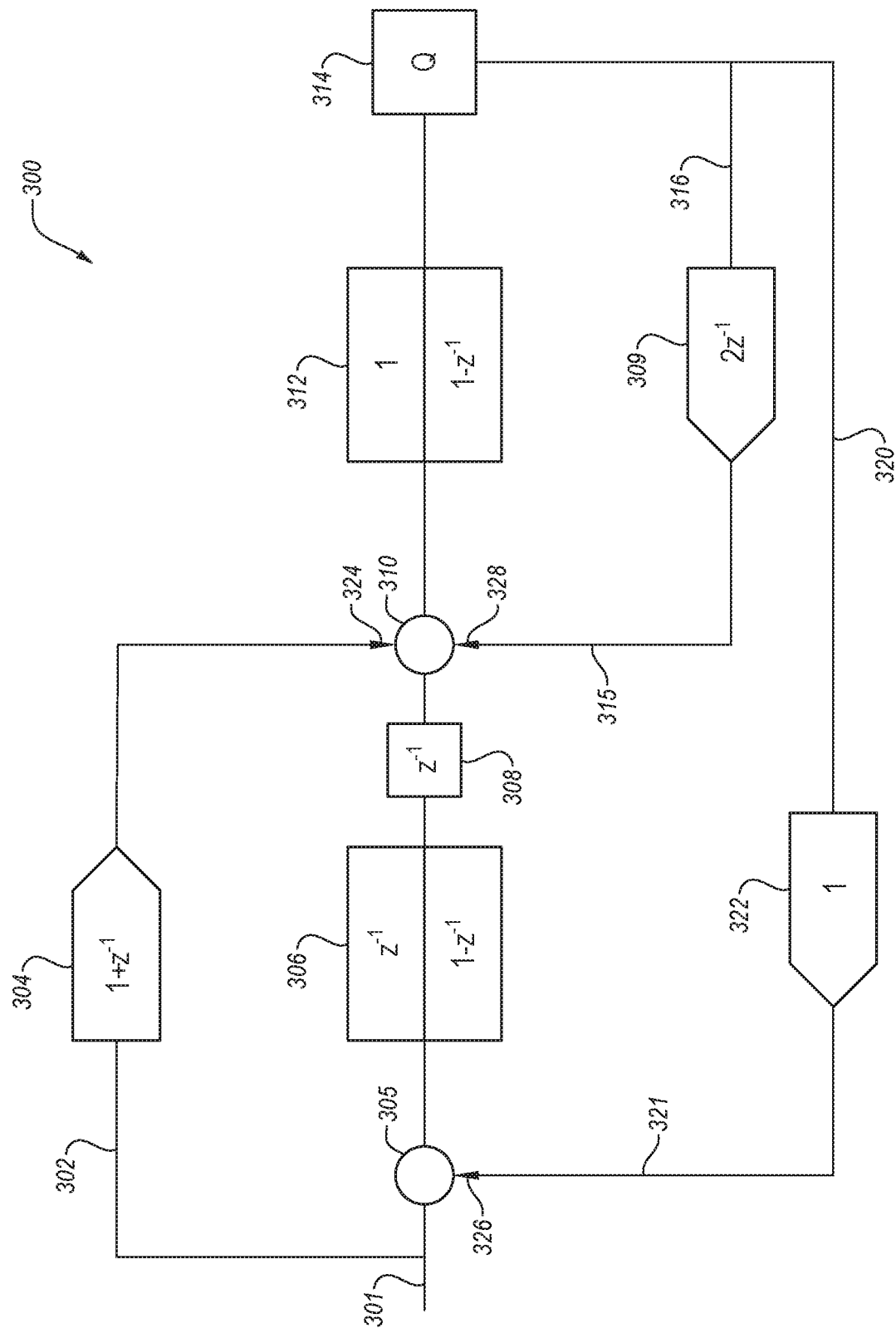
FIG. 3 depicts an example $2^{nd}$ order delta-sigma loop filter, according to one or more embodiments of the disclosure.

FIG. 3 illustrates a $2^{nd}$ order delta-sigma loop filter 300, according to one or more embodiments of the disclosure. In some embodiments, loop filter 300 may be included within and/or implemented as a delta-sigma modulator and/or delta-sigma ADC.

Loop filter 300, which is configured to receive an input signal 301, includes a summing node 305, a first integrator 306, a summing node 310, a second integrator 312, and a quantizer 314. As illustrated, an output of summing node 305 is operatively coupled to an input of first integrator 306, and an output of first integrator 306 is operatively coupled to an input of summing node 310 via a delay element 308. Delay element 308 may be configured to implement a delay via, for example, a switched capacitor circuit. An output of summing node 310 may be operatively coupled to an input of second integrator 312, and an output of second integrator 312 may be operatively coupled to an input of quantizer 314.

Loop filter 300 also includes a feedforward path 302 operatively coupling an input of loop filter 300 and an input of summing node 310. Feedforward path 302 includes an element 304 and a gain stage (e.g., an OTA) 324.

Further, loop filter 300 includes a feedback path 316 operatively coupling an output of quantizer 314 and an input of summing node 310. Feedback path 316 includes a DAC 309 and a gain stage (e.g., an OTA) 328. Loop filter 300 also includes a feedback path 320 operatively coupling an output of quantizer 314 and an input of summing node 305. Feedback path 320 includes a DAC 322 and a gain stage (e.g., an OTA) 326.

Feedback path 316 and feedback path 320 may be characterized by the same discrete transform coefficient, or feedback path 316 and feedback path 320 may be characterized by different discrete transform coefficients.

During a contemplated operation of loop filter 300, summing node 305 may receive input signal 301 and a first feedback signal 321 from feedback path 320. Summing node 305 may subtract feedback signal 321 from input signal 301, and an output signal of summing node 305 may be conveyed to first integrator 306. Further, input signal 301 may be conveyed, via feedforward path 302, to second summing node 310, which may subtract input signal 301 and a feedback signal 315 of feedback path 316 from an output signal of first integrator 306. An output signal of second summing node 310 may be conveyed to second integrator 312, and an output signal of second integrator 312 may be conveyed to quantizer 314 (e.g., a comparator and a latch).

According to some embodiments, the loading on first integrator 306 may be approximately ⅓ of the conventional feedforward loop filters described above. Further, there is little or no (inconsequential) settling on feedforward path 302, unlike conventional feedforward delta-sigma loop filter 160 shown in FIG. 1C.

Figure 4:
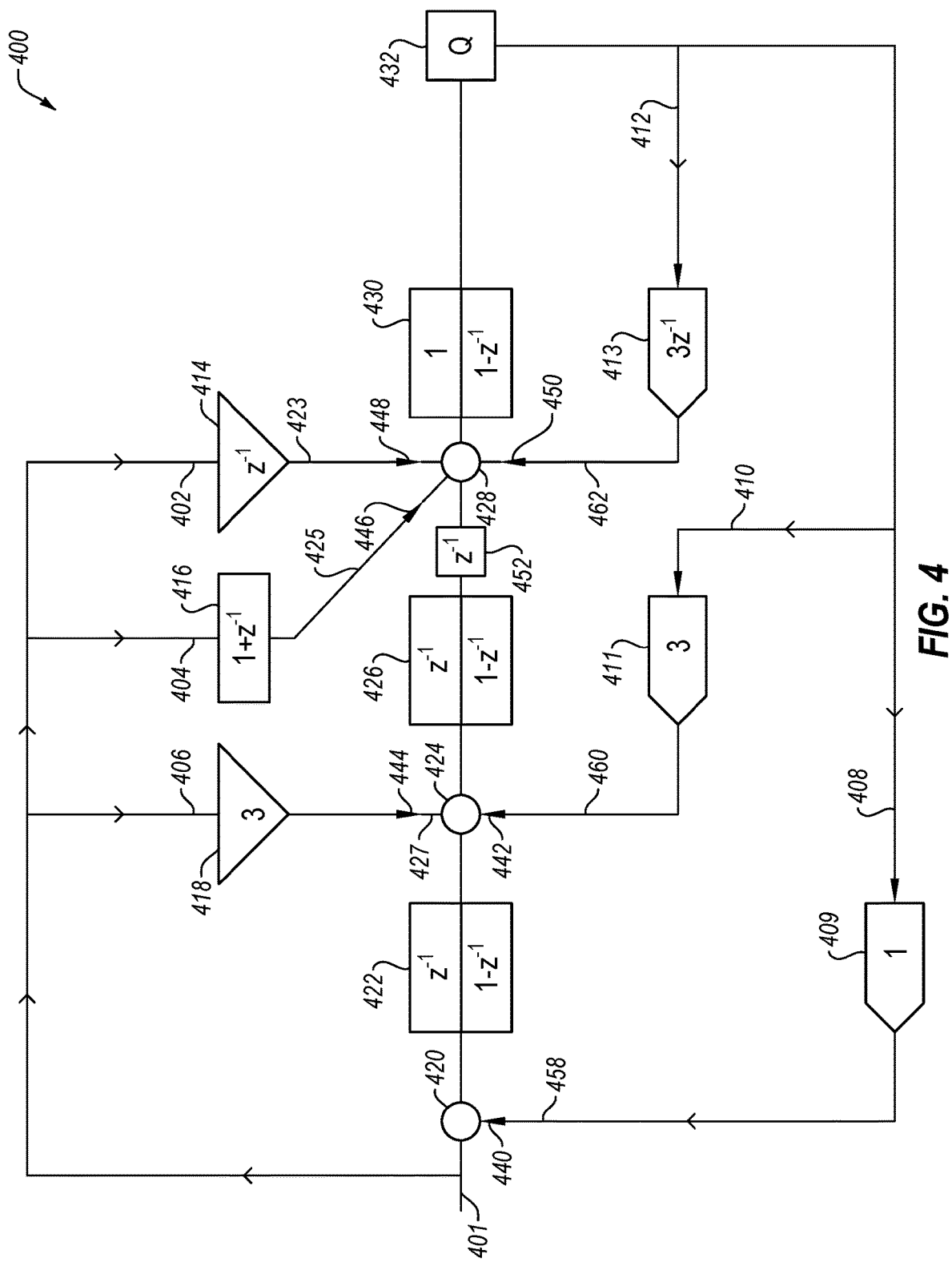
FIG. 4 shows an example $3^{rd}$ order delta-sigma loop filter, according to various embodiments of the disclosure.

FIG. 4 depicts an example 3rd order delta-sigma loop filter 400, according to various embodiments of the disclosure. In some embodiments, loop filter 400 may be included within and/or implemented as a delta-sigma modulator and/or a delta-sigma ADC.

Loop filter 400 includes summing nodes 420, 424, and 428, integrators 422, 426, and 430, and a quantizer 432. As illustrated, an output of summing node 420 may be operatively coupled to an input of first integrator 422, and an output of first integrator 422 may be operatively coupled to an input of summing node 424. An output of summing node 424 may be operatively coupled to an input of second integrator 426, and an output of second integrator 426 may be operatively coupled to summing node 428 via a delay element 452. Delay element 452 may be configured to implement a delay via, for example, a switched capacitor circuit. Also, an output of summing node 428 may be operatively coupled to an input of third integrator 430, and an output of third integrator 430 may be operatively coupled to an input of quantizer 432.

Loop filter 400 further includes a feedforward path 402, a feedforward path 404, a feedforward path 406. Feedforward path 402 operatively couples an input of loop filter 400 and an input of summing node 428, and feedforward path 402 includes an element 414 and a gain stage (e.g., OTA) 448. Feedforward path 404 operatively couples an input of loop filter 400 and an input of summing node 428, and feedforward path 404 includes an element 416 and a gain stage (e.g., OTA) 446. Feedforward path 406 operatively couples an input of loop filter 400 and an input of summing node 424, and feedforward path 406 includes an element 418 and a gain stage (e.g., OTA) 444.

Loop filter 400 also includes a feedback path 408, a feedback path 410, and a feedback path 412. Feedback path 408 is coupled between an output of quantizer 432 and summing node 420, and feedback path 408 includes a DAC 409 and a gain stage (e.g., OTA) 440. Feedback path 410 operatively couples an output of quantizer 432 and an input of summing node 424, and feedback path 410 includes DAC 411 and a gain stage (e.g., OTA) 442. Feedback path 412 operatively couples an output of quantizer 432 and an input of summing node 428, and feedback path 412 includes DAC 413 and a gain stage (e.g., OTA) 450. On or more of feedback paths 408, 410, and 412 may be characterized by the same coefficient, or feedback path 408, feedback path 410, and feedback path 412 may each be characterized by different coefficients. In some embodiments, DAC 409, DAC 411, and/or DAC 413 may determine feedback gain and/or loop zero and poles for associated path.

During a contemplated operation of loop filter 400, summing node 420 may receive an input signal 401 and a feedback signal 458 from feedback path 408. Summing node 420 may subtract feedback signal 458 from input signal 401, and an output signal of summing node 420 may be conveyed to integrator 422. An output signal of integrator 422 may be conveyed to summing node 424. Further, input signal 401 may be conveyed via feedforward path 402, feedforward path 404, and feedforward path 406. Feedforward path 402 may convey a feedforward signal 423 to summing node 428, feedforward path 404 may convey a feedforward signal 425 to summing node 428, and feedforward path 406 may convey a feedforward signal 427 to summing node 424.

Summing node 424 may subtract feedforward signal 427 and a feedback signal 460 from an output of first integrator 422, and an output of summing node 424 may be conveyed to integrator 426. An output of integrator 426 may be conveyed to summing node 428 via delay element 452. Summing node 428 may subtract feedforward signal 423, feedforward signal 425, and a feedback signal 462 from an output of integrator 426, and an output of summing node 428 may be conveyed to integrator 430. An output of integrator 430 may be conveyed to quantizer 432, and an output of quantizer 432 may be conveyed via feedback paths 408, 410, and 412.

As illustrated, first integrator 422 and second integrator 426 may not receive the input of loop filter 400, and, in at least some embodiments, the primary role of first integrator 422 and second integrator 426 may be to process quantization noise.

According to some embodiments, a loop filter may be included within and/or implemented as a quadrature delta-sigma modulator, and more specifically, a quadrature delta-sigma loop filter. More specifically, in some embodiments, a quadrature delta-sigma loop filter may be implemented via one or more cross coupling paths that operatively couple two channels of a loop filter. Further, as described more fully below, in some embodiments, the one or more coupling paths of a loop filter may be configurable and/or programmable.

Figure 5:
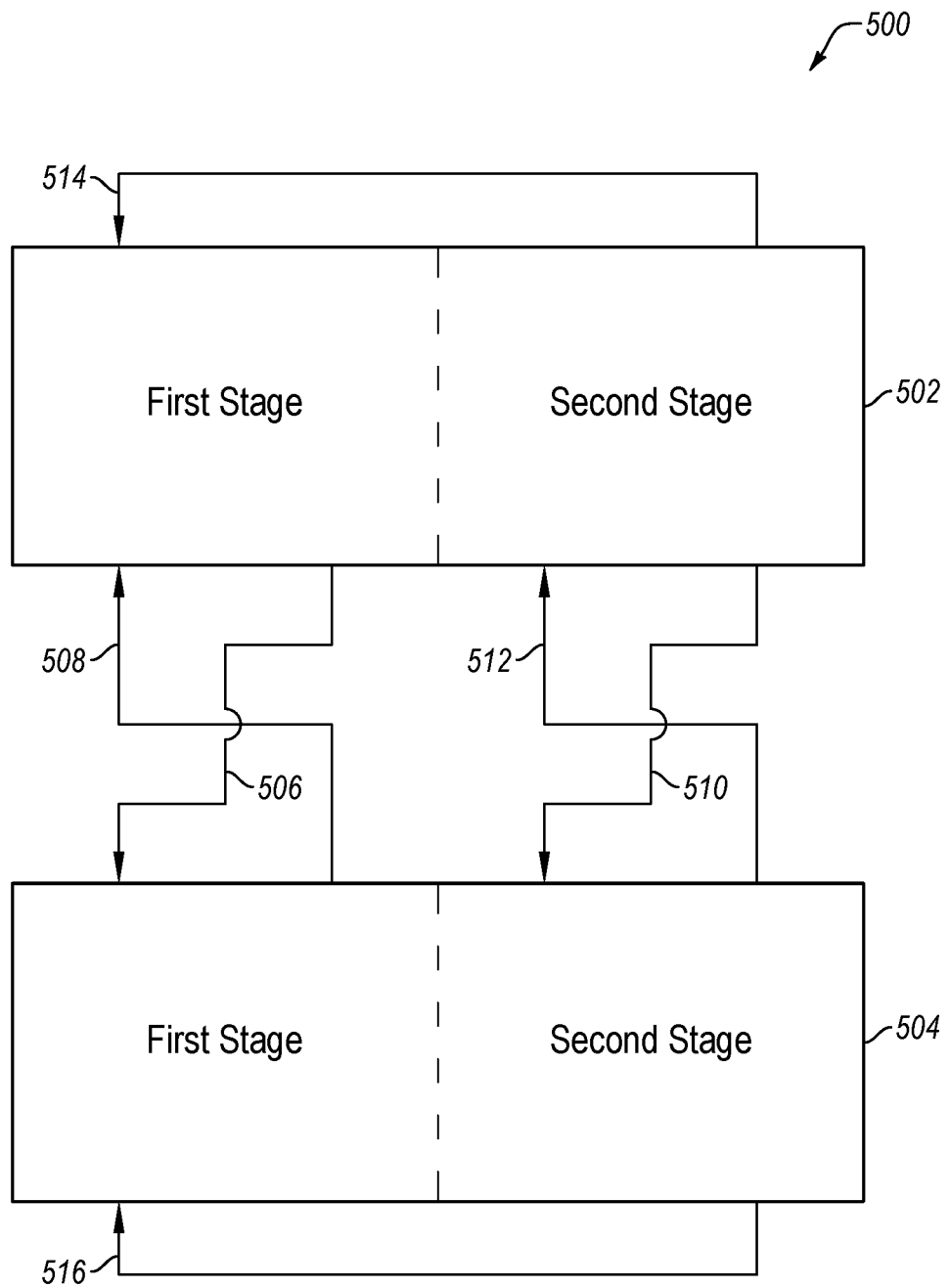
FIG. 5 shows an example delta-sigma loop filter including in-phase and quadrature channels and cross coupling paths, according to various embodiments of the present disclosure.

FIG. 5 depicts a quadrature delta-sigma loop filter 500, according to various embodiments of the disclosure. Delta-sigma loop filter 500 includes an in-phase channel ("I-channel") 502 and a quadrature channel ("Q-channel") 504. Each of I-channel 502 and Q-channel 504 includes a number of integrator stages (e.g., $1^{st}$ and $2_{nd}$ stages shown in FIG. 5). Further, loop filter 500 includes coupling paths 506, 508, 510, and 512. I-channel 502 and Q-channel 504 may each include a loop filter, such as any loop filter disclosed herein, or another loop filter. Further, as disclosed more fully below, one or more of cross coupling paths 506, 508, 510, and 512 may be characterized by a coefficient. Moreover, as described more fully below, one or more cross coupling paths 506, 508, 510, and 512 may be enabled and disabled and/or coefficients of one or more cross coupling paths 506, 508, 510, and 512 may be programmable.

According to some embodiments, an output of a stage of I-channel 502 (e.g., at an input of a quantizer) may be coupled to an input of a corresponding stage of Q-channel 504 (e.g., at an input of a summing node). Further, an output of a stage of Q-channel 504 (e.g., at an input of a quantizer) may be coupled to an input of a corresponding stage of I-channel 502 (e.g., at an input of a summing node). Moreover, in some embodiments, an output of a stage (e.g., a second stage) of I-channel 502 (e.g., at an input of a quantizer) may be coupled to an input of another stage (e.g., a first stage) of I-channel 502 (e.g., at an input of a summing node). Further, an output of a stage (e.g., a second stage) of Q-channel 504 (e.g., at an input of a quantizer) may be coupled to an input of another stage (e.g., a first stage) of Q-channel 504 (e.g., at an input of a summing node).

More specifically, as illustrated, coupling path 506 may be operatively coupled between an output of a first stage of I-channel 502 (e.g., at an input of a quantizer) and an input of a first stage of Q-channel 504 (e.g., at an input of a summing node), and coupling path 508 may be operatively coupled between an output of a first stage of Q-channel 504 (e.g., at an input of a quantizer) and an input of a first stage of I-channel 502 (e.g., at an input of a summing node). Moreover, coupling path 510 may be operatively coupled between an output of a second stage of I-channel 502 (e.g., at an input of a quantizer) and an input of a second stage of Q-channel 504 (e.g., at an input of a summing node), and coupling path 512 may be operatively coupled between an output of a second stage of Q-channel 504 (e.g., at an input of a quantizer) and an input of a second stage of I-channel 502 (e.g., at an input of a summing node).

Further, as illustrated, coupling path 514 may be operatively coupled between an output of the second stage of I-channel 502 (e.g., at an input of a quantizer) and input of the first stage (e.g., a first stage) of I-channel 502 (e.g., at an input of a summing node). Moreover, coupling path 516 may be operatively coupled between an output of the second stage of Q-channel 504 (e.g., at an input of a quantizer) an input of the first stage (e.g., a first stage) of Q-channel 504 (e.g., at an input of a summing node).

Although delta-sigma loop filter 500 is illustrated as a two stage loop filter, embodiments of the disclosure are not so limited, and delta-sigma loop filter may include any number of stages. For example, in an embodiment wherein a loop filter includes three stages, an output of a third stage of an I-channel (e.g., at an input of a quantizer) may be coupled to an input of a third stage of a Q-channel (e.g., at an input of a summing node), and an output of the third stage of an Q-channel (e.g., at an input of a quantizer) may be coupled to an input of the third stage of a I-channel (e.g., at an input of a summing node).

Figure 6A:
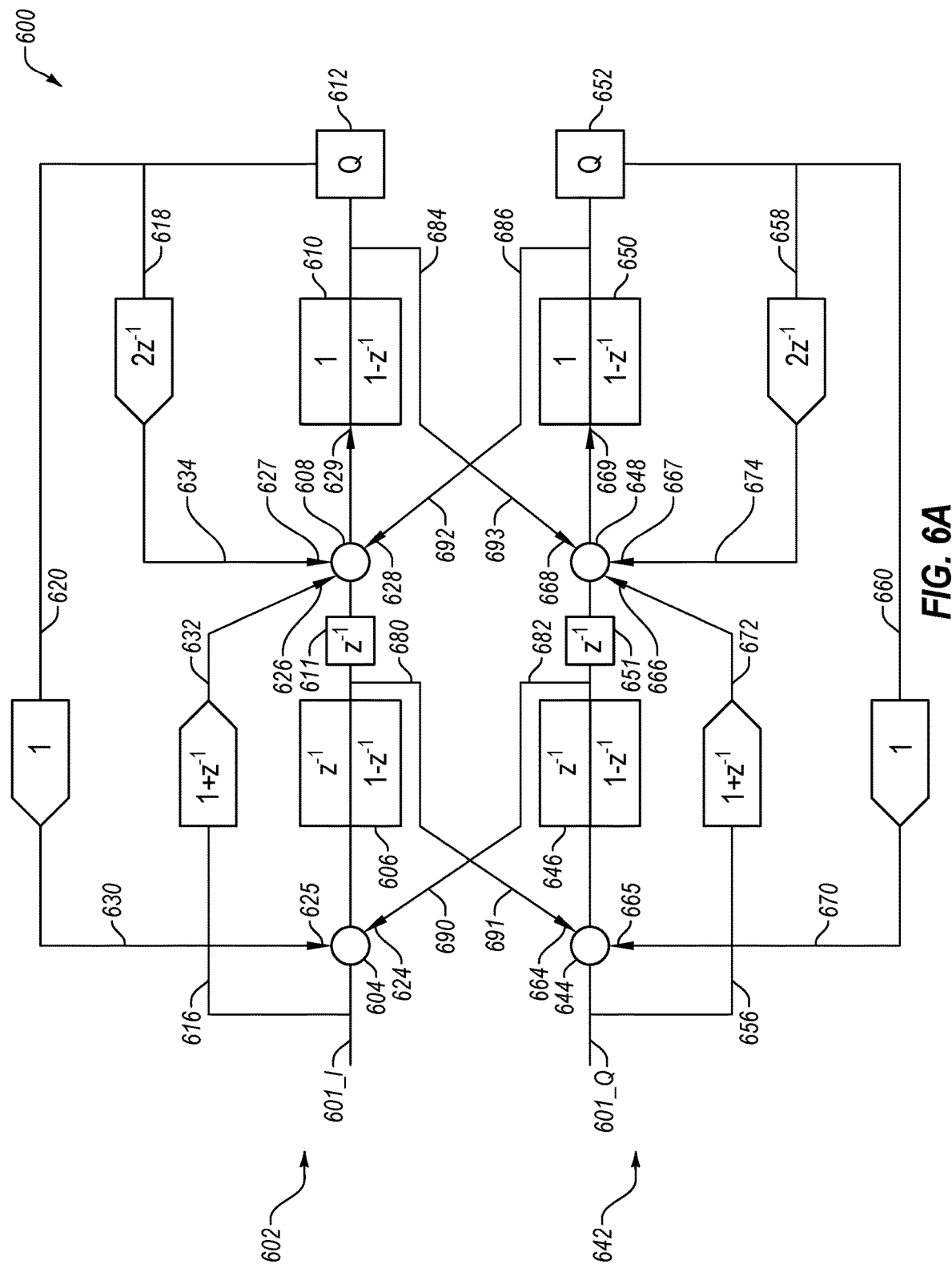
FIG. 6A shows an example $2^{nd}$ order delta-sigma loop filter including in-phase and quadrature channels, in accordance with various embodiments of the disclosure.

FIG. 6A shows a $2^{nd}$ order quadrature delta-sigma loop filter 600, according to various embodiments of the disclosure. Loop filter 600 may include an in-phase channel ("I-channel") 602 and a quadrature channel ("Q-channel") 642. I-channel 602 includes summing nodes 604 and 608, integrators 606 and 610, a delay element 611, and a quantizer 612. I-channel 602 further includes a feedforward path 616, a feedback path 618, and a feedback path 620. Q-channel 642 includes summing nodes 644 and 648, integrators 646 and 650, a delay element 651, and a quantizer 652. Q-channel 642 further includes a feedforward path 656, a feedback path 658, and a feedback path 660. Further, I-channel 602 includes gain stages (e.g., OTAs) 624, 625, 626, 627, 628, and 629, and Q-channel 642 includes gain stages (e.g., OTAs) 664, 665, 666, 667, 668, and 669.

In some embodiments, each of integrators 606, 610, 646, and 650 may include a quadrature integrator. In these embodiments, quadrature may be implemented via cross coupling paths 680, 682, 684, and 686. More specifically, an output of integrator 606 may be coupled to summing node 644 via coupling path 680, an output of integrator 610 may be coupled to summing node 648 via coupling path 684, an output of integrator 646 may be coupled to summing node 604 via coupling path 682, and an output of integrator 650 may be coupled to summing node 608 via coupling path 686.

During a contemplated operation of loop filter 600, summing node 604 may receive an input signal 601_I, a feedback signal 630 from feedback path 620, and a signal 690 (i.e., via cross coupling path 682). Summing node 604 may subtract feedback signal 630 and signal 690 from input signal 601_I, and an output signal of summing node 604 may be conveyed to integrator 606. An output signal of integrator 606 may be conveyed to summing node 608 via delay element 611. Further, input signal 601_I may be conveyed via feedforward path 616, which may convey a feedforward signal 632 to summing node 608. A feedback signal 634, conveyed via feedback path 618, may also be conveyed to summing node 608.

Summing node 608 may subtract feedforward signal 632, feedback signal 634, and a signal 692 (i.e., via cross coupling path 686) from an output of first integrator 606, and an output signal of summing node 608 may be conveyed to integrator 610. An output signal of integrator 610 may be conveyed to quantizer 612, and an output signal of quantizer 612 may be conveyed via feedback paths 618 and 620.

Further, summing node 644 may receive an input signal 601_Q, a feedback signal 670 from feedback path 660, and a signal 691 (i.e., via cross coupling path 680). Summing node 644 may subtract feedback signal 670 and signal 691 from input signal 601_Q, and an output signal of summing node 644 may be conveyed to integrator 646. An output signal of integrator 646 may be conveyed to summing node 648 via delay element 651. Further, input signal 601_Q may be conveyed via feedforward path 656, which may convey a feedforward signal 672 to summing node 648. A feedback signal 674, conveyed via feedback path 658, may also be conveyed to summing node 648.

Summing node 648 may subtract feedforward signal 672, feedback signal 674, and a signal 693 (i.e., via cross coupling path 684) from an output of first integrator 646, and an output signal of summing node 648 may be conveyed to integrator 650. An output of integrator 650 may be conveyed to quantizer 652, and an output signal of quantizer 652 may be conveyed via feedback paths 658 and 660.

Figure 6B:
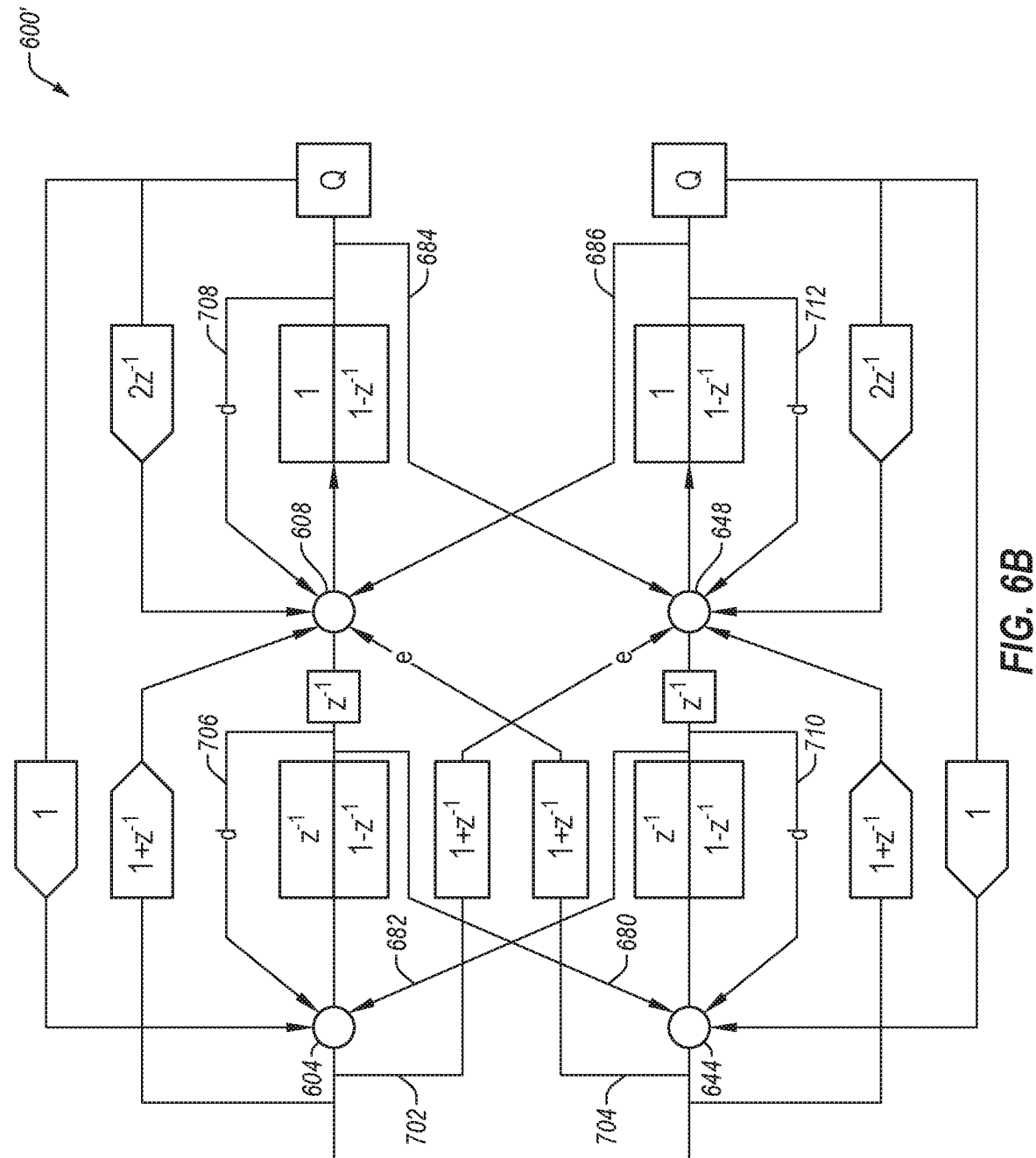
FIG. 6B illustrates another example $2^{nd}$ order delta-sigma loop filter including in-phase and quadrature channels, in accordance with various embodiments of the disclosure.

FIG. 6B shows another example $2^{nd}$ order delta-sigma loop filter 600', according to various embodiments of the disclosure. Filter 600', which may be implemented as, for example, a delta-sigma modulator and/or a delta-sigma ADC, is similar to loop filter 600 of FIG. 6A. However, loop filter 600' includes feedforward paths 702 and 704, each with a coefficient e. Loop filter 600' also includes feedback paths 706, 708, 710, and 712, each with a coefficient d. While these paths may have a relatively small impact in low-IF/zero-IF cases, feedforward paths 702 and 704 may further eliminate the input signal at the output of the first integrator (e.g., integrators 606 and 646; see FIG. 6A). In at least some embodiments, the quadrature integrators may have a transfer function of $z^{-1}/(1-z^{-1}(1+d+cj))$, and thus, the integrator zeros may be at $z=1+d+cj$.

Figure 7:
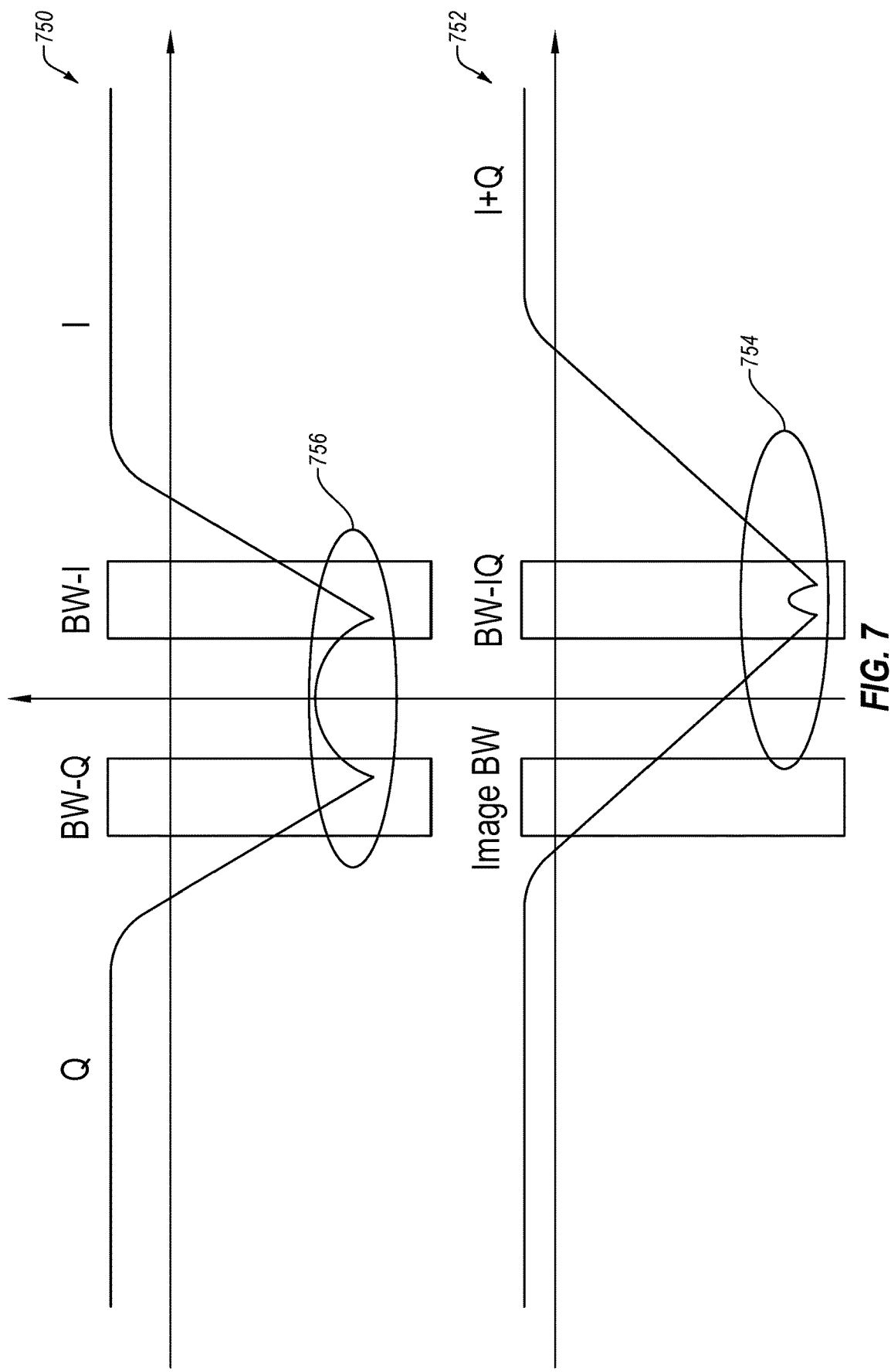
FIG. 7 depicts a plurality of plots showing locations of zeros for feedback zero optimization and quadrature zero optimization.

FIG. 7 depicts a plot 750 and a plot 752, illustrating an example of how quadrature zero optimization (e.g., as shown in FIGS. 6A and 6B) may be more efficient than low-pass zero optimization (e.g., as shown in FIGS. 3 and 4). As noted above, and with reference to plot 752, in quadrature zero optimization, there are two zeros 754 in the signal band. In comparison, as shown in plot 750, in low-pass zero optimization, there are two zeros 756, one zero in the signal band and one zero in the image band. In some embodiments, low-pass zero optimization may provide, for example, a 3-dB benefit from I+Q, and quadrature zero optimization may provide higher order noise shaping from I+Q (e.g., a 10+dB benefit in Qnoise shaping).

Other embodiments of the present disclosure relate to programmable receivers. More specifically, according to some embodiments, a programmable receiver may include a loop filter that may be configured and/or reconfigured between low-pass or quadrature delta-sigma via enabling and/or disabling one or more coefficients of one or more coupling paths of the loop filter. Further, in some embodiments, by programming one or more coefficients of one or more coupling paths, a bandwidth center-frequency (e.g., of a receiver including loop filter 600) may be programmed. Thus, in these and other embodiments, a receiver including a configurable ADC (e.g., loop filter 600) may switch between a zero-intermediate frequency (Zero-IF) operation and low-intermediate frequency (Low-IF) operation with minimal hardware requirement.

Figure 8:
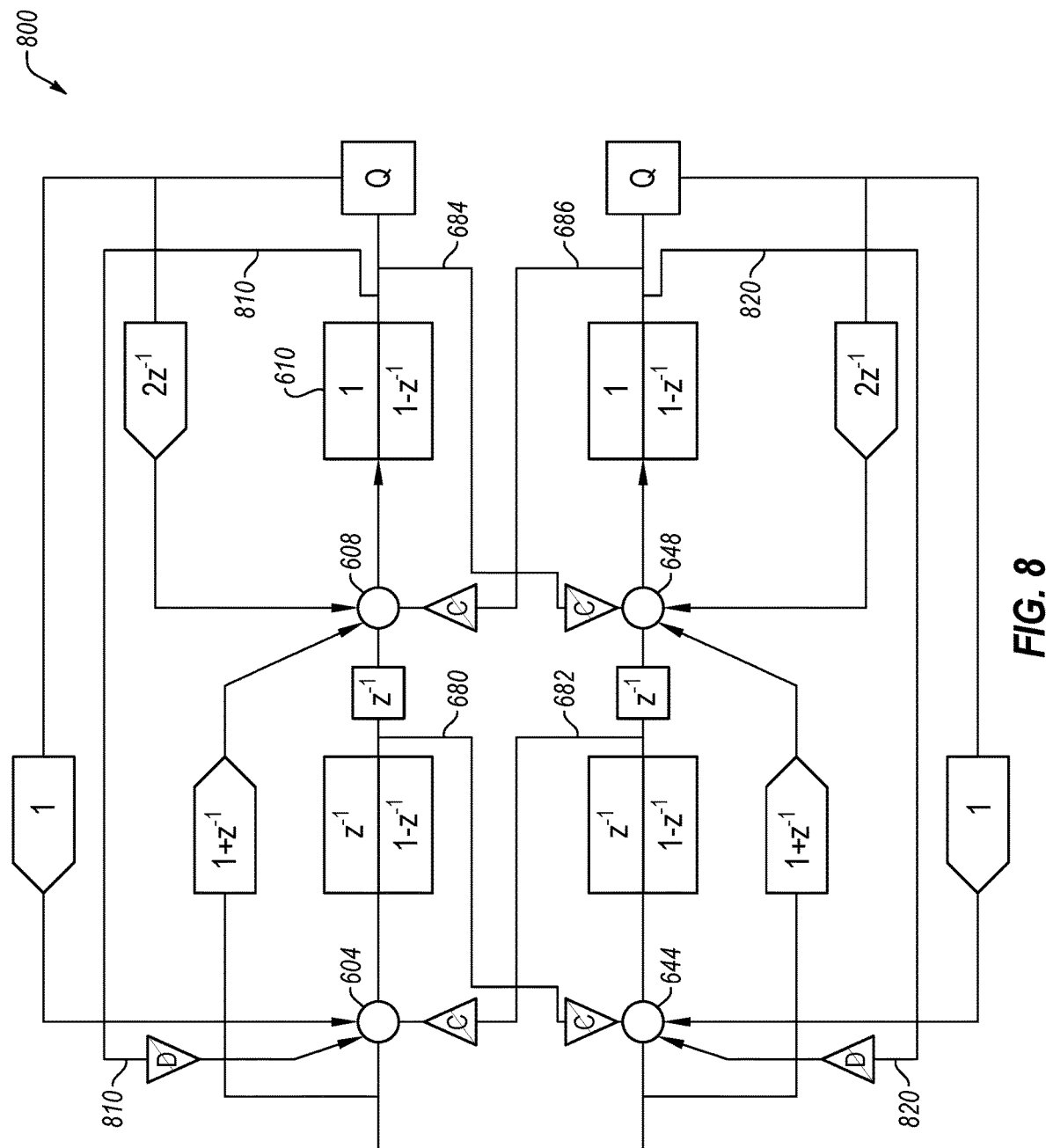
FIG. 8 illustrates an example programmable $2^{nd}$ order delta-sigma loop filter including in-phase and quadrature channels, according to various embodiments of the present disclosure.

FIG. 8 shows an embodiment of a $2^{nd}$ order delta-sigma loop filter 800, according to various embodiments of the disclosure. In some embodiments, loop filter 800 may be included within and/or implemented as a delta-sigma modulator and/or a delta-sigma ADC. Loop filter 800 is similar to loop filter 600 of FIG. 6A. However, loop filter 800 further includes a feedback path 810 from an output of integrator 610 to an input of summing node 604. Loop filter 800 also includes a feedback path 820 from an output of integrator 650 to an input of summing node 644. Feedback path 810 and feedback path 820 may each be referred to herein as a variable gain path.

In some embodiments, loop filter 800, which may include, or may be part of, a configurable ADC and/or a configurable receiver, may be configured by enabling/disabling one or more of cross coupling paths 680, 682, 684, and 686 and/or variable gain paths 810 and 820. In at least one embodiment, a cross coupling path may be enabled/disabled by configuring a gain on the path. For example, in a low-pass mode, zero optimization (for optimizing noise shaping) may be accomplished via enabling and/or programming (e.g., via one or more control signals) a coefficient D of variable gain paths 810 and 820. Further, for example, in a quadrature mode, paths 810 and 820 may be disabled and paths 680, 682, 684, and 686 may be enabled, and a bandwidth center-frequency may be adjusted by programming a coefficient C. Thus, in at least one embodiment, a configurable receiver may be implemented using loop filter 800. Further, the receiver may be programmed to be used as either a Zero-IF or a Low-IF receiver by configuring loop filter 800 to operate in a low-pass mode or quadrature mode. Moreover, the configurable receiver may be configured for zero optimization by enabling variable gain paths 810 and 820 while cross coupling paths 680, 682, 684, and 686 are disabled.

Figure 9:
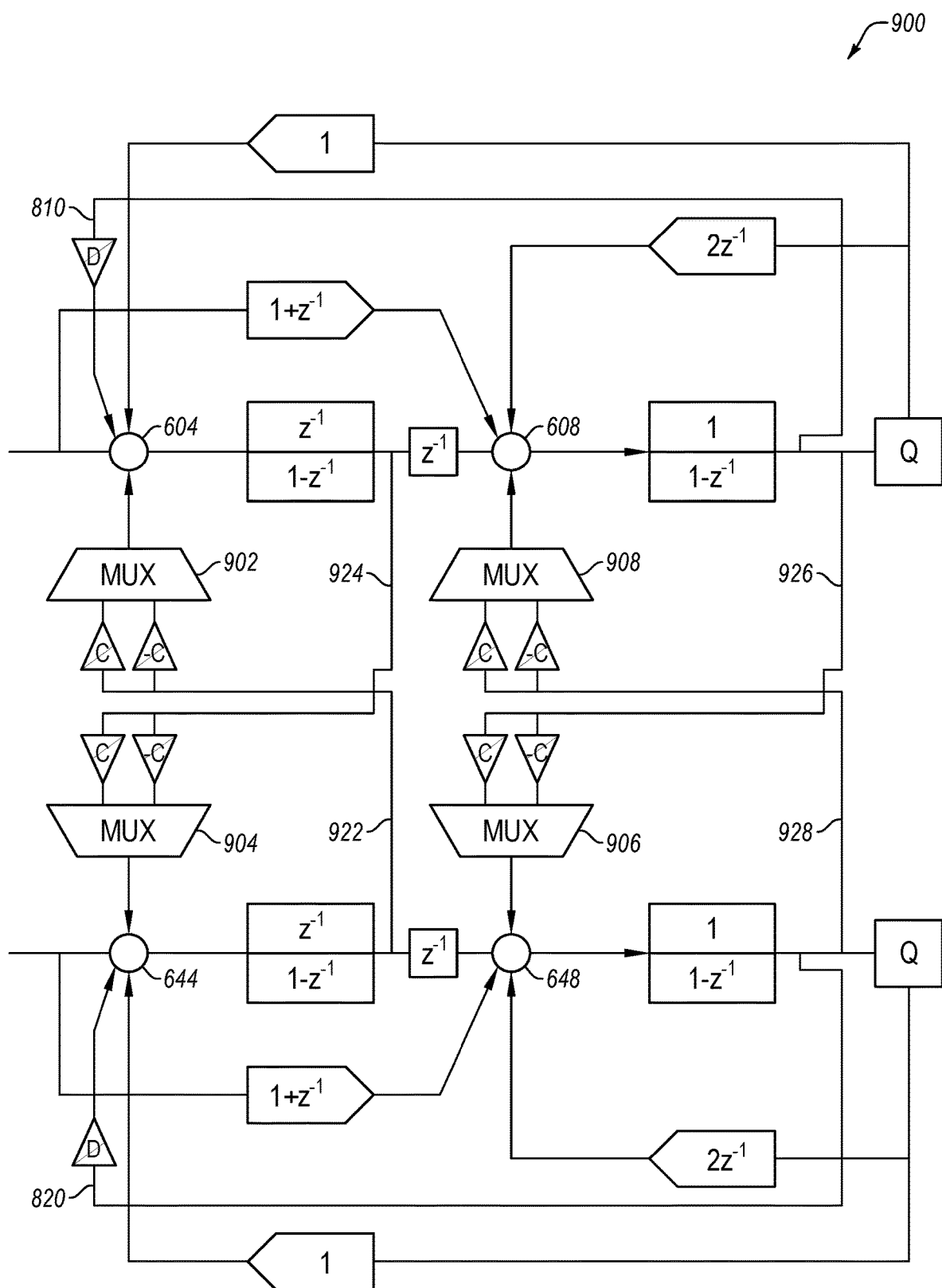
FIG. 9 shows yet another example programmable $2^{nd}$ order delta-sigma loop filter including in-phase and quadrature channels, according to various embodiments of the disclosure.

FIG. 9 depicts another $2^{nd}$ order delta-sigma loop filter 900, according to various embodiments of the disclosure. According to some embodiments, loop filter 900 may be implemented in a configurable receiver, where a polarity of one or more cross coupling IQ paths may be changed. Loop filter 900 is similar to loop filter 800 of FIG. 8, however, filter 900 also includes multiplexers 902, 904, 906, and 908, which enable switching (e.g., in response to one or more control signals received at one or more of multiplexers 902, 904, 906, and 908) the polarity of the cross coupling coefficients C of cross coupling paths 922, 924, 926, and 928. Switching the polarity of one or more of cross coupling paths 922, 924, 926, and 928 may enable for changeover from the signal band to the image band, and vice versa.

Notably, there are at least four levels of programming/configuration enabled by delta-sigma loop filter 900 shown in FIG. 9. The levels of programming include, but are not limited to: (1) enabling/disabling a quadrature/low-pass mode; (2) switching between signal band and image band by selecting a polarity of the bandwidth center frequency; (3) zero optimization in a low-pass mode by enabling/disabling one or more variable gain paths; and (4) programming the ADC bandwidth center frequency in a quadrature mode by configuring one or more cross coupling coefficients. In at least one embodiment, one or more levels of programming of a loop filter (e.g., loop filter 500 of FIG. 5, loop filter 600 of FIG. 6A, loop filter 600' of filter 6B, loop filter 800 of FIG. 8, and loop filter 900 of FIG. 9) may be set via a selection unit, which may include relatively less hardware compared to the embodiments shown in FIGS. 11A and 11B. A selection unit may include, for example only, a configurable state machine, a switched capacitor network, logic, or any other suitable selection unit.

Figure 10:
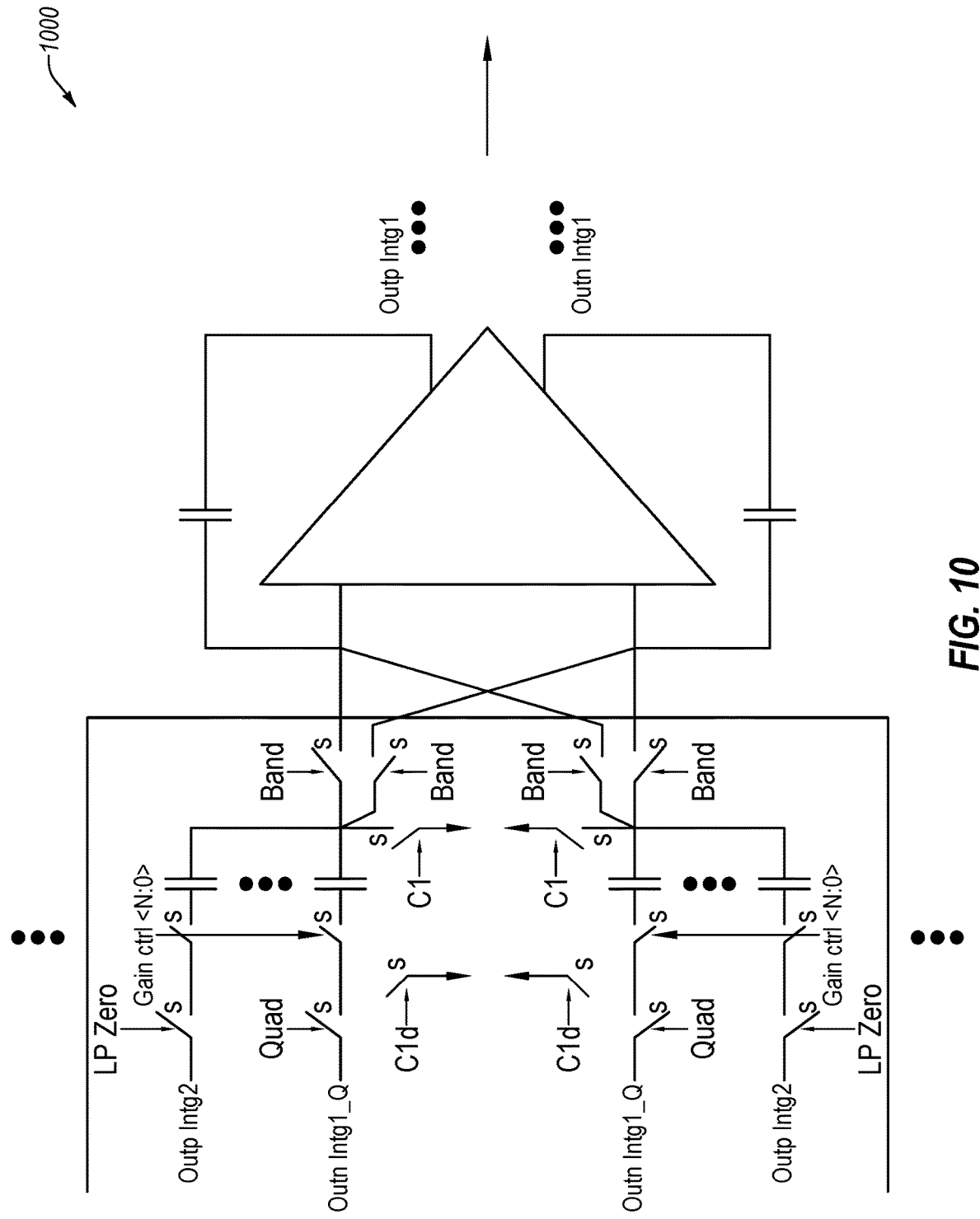
FIG. 10 shows an example switched capacitor network, in accordance with one or more embodiments of the disclosure.

FIG. 10 shows an example switched capacitor network 1000, in accordance with one or more embodiments of the disclosure. Switched capacitor network 1000 may be configured (e.g., via one or more switches S) to enable one or more dimensions (e.g., four-dimensions) of programming of a quadrature delta-sigma ADC (e.g., loop filter 900 shown in FIG. 9).

For example, a quad control signal Quad may enables for programming in a quadrature mode (e.g., enable one or more path including coefficient C). Further, an LP_zero signal may enable feedback from a second integrator (e.g., integrator 610 and/or integrator 650) in a low-pass mode for zero optimization (e.g., enable one or more paths including coefficient D). For example, setting LP_zero and Quad to zero may configure a loop filter (e.g., loop filter 900 of FIG. 9) in low pass mode without zero optimization. A signal Gain ctrl<N:0> may enable gain programming of one or more paths including coefficients C and/or D in both quadrature and low pass modes. Signals Band+ and Band− may enable for changing polarity in the quadrature mode (e.g., to choose between positive and negative signal bands).

As disclosed herein, one advantage of various embodiments of delta-sigma ADC loop filters is that a positive or negative signal bandwidth center frequency may be selected. Further, in accordance with various embodiments, a configurable receiver may compensate for local oscillator spurs by switching to the image band by selecting between a mode that uses a positive signal bandwidth center frequency and a mode that uses a negative signal bandwidth center frequency.

Figure 11A:
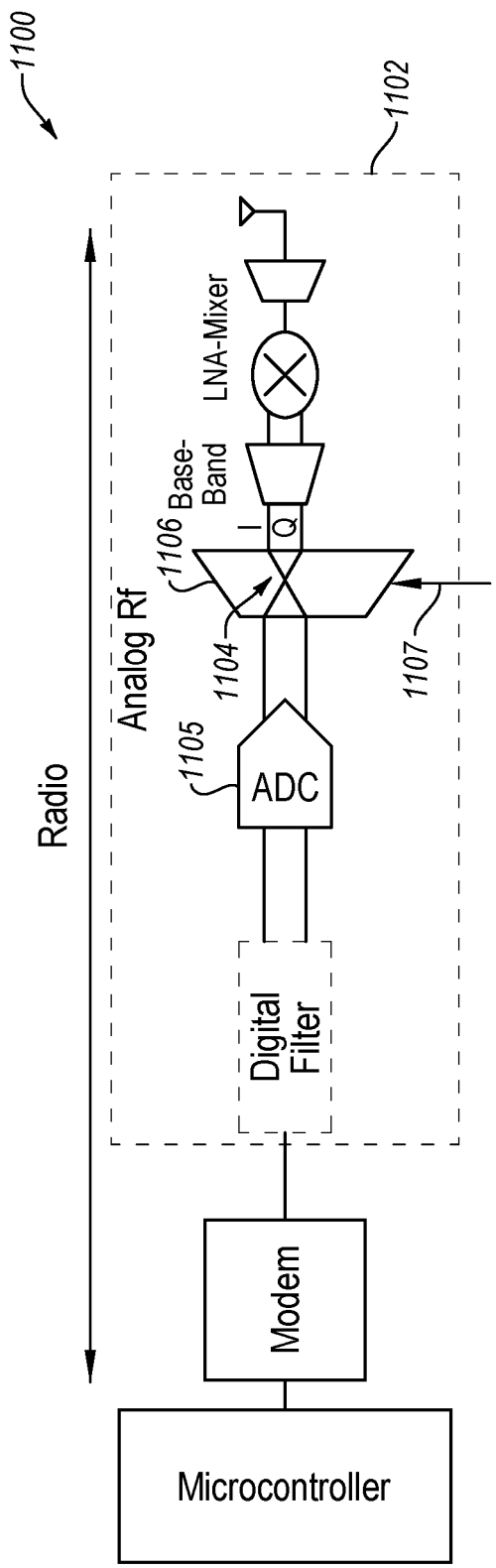
FIG. 11A illustrates an example device including a programmable receiver, according to various embodiments of the present disclosure.
Figure 11B:
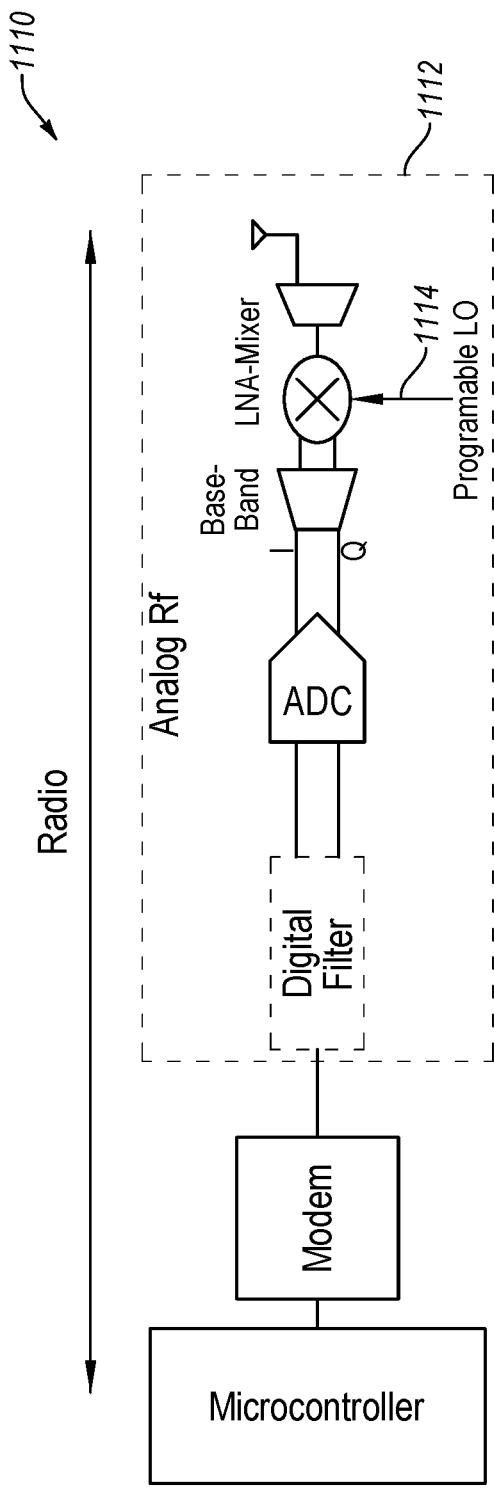
FIG. 11B depicts another example device including a programmable receiver, in accordance with various embodiments of the present disclosure.

FIG. 11A shows an embodiment of system 1100, according to various embodiments of the disclosure. System 1100 includes a configurable receiver 1102, where I & Q channels 1104 may be swapped (e.g., before receipt of I & Q signals at an ADC 1105). In at least some embodiments, a multiplexer 1106 may receive one or more control signals 1107, and, in response thereto, may swap I & Q channels 1104. FIG. 11B shows an embodiment of a system 1110 configurable receiver 1112 wherein a frequency of a local oscillator (LO) signal 1114 received at receiver 1112 may be adjustable.

Quadrature zero optimization may be more efficient than low-pass zero optimization in low power RF applications, by way of example Bluetooth Low Energy ("BLE"), where a receiver is low-IF (center of signal bandwidth offsets from zero frequency) and zeros in the image band are inefficient. Benefits and advantages of a configurable receiver that implements one or more embodiments of quadrature delta-sigma ADC loop filters are discussed below in connection with FIGS. 11A and 11B. For example, in low power applications, power may be reduced by, for example only, a factor of 2 or 3, with possibly some performance degradation.

Figure 12:
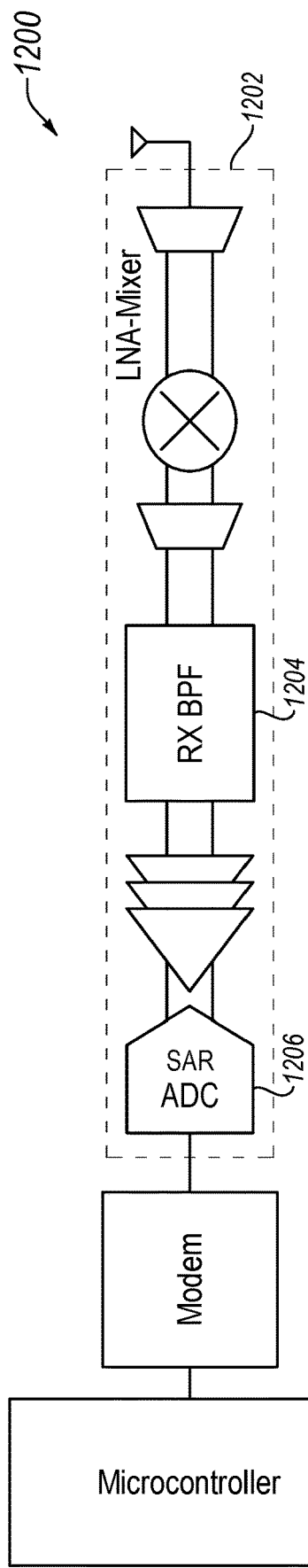
FIG. 12 depicts a top level system-on-chip.

FIG. 12 shows a top level system-on-chip (SoC) 1200 that includes a wireless receiver 1202 with complex analog filtering 1204 (e.g., a Berkley Packet Filter) and a medium-resolution ADC 1206 (e.g., a successive-approximation-register ADC), according to the state of the art as understood by the inventors of this disclosure.

Figure 13:
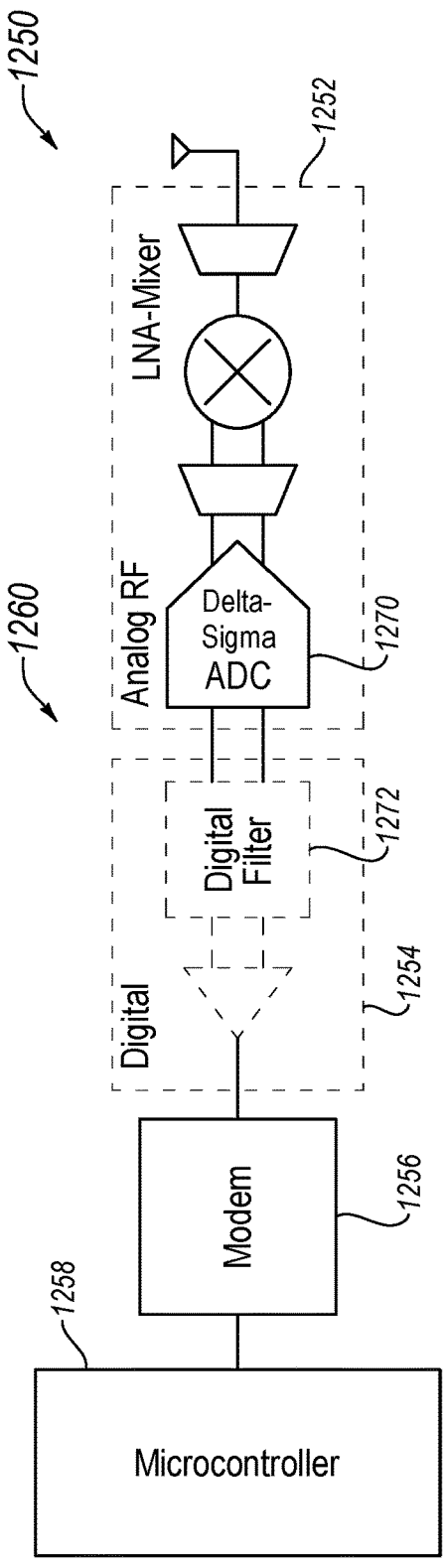
FIG. 13 shows an example top level system-on-chip including a delta-sigma analog-to-digital converter, according to various embodiments of the disclosure.

FIG. 13 shows a top level SoC 1250, according to various embodiments of the disclosure. As illustrated, SOC 1250 includes an analog module 1252, a digital module 1254, a modem 1256, and a microcontroller 1258. For example, in some embodiments, analog module 1252, digital module 1254, and modem 1256 may include, or may part of, a radio 1260.

Analog module 1252, which may include an analog RF module, includes a delta-sigma ADC 1270. For example, ADC 1270 may include one or more loop filters, arranged in accordance with one or more embodiments of the disclosure. For example, ADC 1270 may include loop filter 300 of FIG. 3, loop filter 400 of FIG. 4, loop filter 500 of FIG. 5, loop filter 600 of FIG. 6A, loop filter 600' of filter 6B, loop filter 800 of FIG. 8, and loop filter 900 of FIG. 9. An output of delta-sigma ADC 1270 may be coupled to a digital filter 1272 of digital module 1254.

Notably, complex analog filtering 1204 of FIG. 12 is replaced with a digital filter 1272 and delta-sigma ADC 1270 of FIG. 13. Thus, in at least these embodiments, filtering may be moved from a power hungry analog domain (FIG. 12) to the less power hungry digital domain (FIG. 13). Moreover, the higher resolution delta-sigma ADC 1270 may enable for a dynamic range improvement with a proportional reduction in filtering (and elimination of unnecessary filter blocks before ADC 1206 as shown in FIG. 12). The reduced power consumption may make various embodiments described herein particularly useful for low power RF applications and may improve the signal-to-quantization-noise-ratio (SNQR) compared to receiver 1202 illustrated in FIG. 12.

Various embodiments of the disclosure may eliminate a need for a summing gain stage (e.g., amplifier) in an input feedforward path of delta-sigma loop filters. Further, various embodiments may preserve the benefits of having an input feedforward in delta-sigma loop filters without adding extra summing gain stages (e.g. OTAs). Some embodiments may not require timing critical paths in feedforward architectures. Moreover, various embodiment may not increase loading of a first integrator, unlike other feedforward delta-sigma loop filters.

Various embodiments may be applied to multi-order (e.g., $2^{nd}$ order, $3^{rd}$ order, etc.) delta-sigma loop filters, and some embodiments may be extended to quadrature delta-sigma loop filters, as well as low-pass delta-sigma loop filters. Further, some embodiments may reduce delta-sigma loop power (e.g., by approximately ⅓) by eliminating a summing gain stage (e.g., amplifier), reducing loading of a first integrator (e.g., integrator 306 of FIG. 3, integrator 422 of FIG. 4, integrator 606 and/or integrator 646 of FIG. 6A), and/or avoiding timing critical paths.

For example, in one specific embodiment, a delta-sigma ADC may exhibit a 67 dB signal noise and distortion ratio (SNDR), utilize approximately 2 MHz of bandwidth, and consume approximately 0.5 mW (I+Q) of power. Further, in this embodiment, a figure of merit (FOM) may be approximately 35f J/conv. Moreover, an oversampling ratio may be approximately 15+, a receiver area may be <1 mm$^2$, filtering before the ADC may be relatively small, and a number of operational amplifiers and DACs may be, for example, 2 or 3 per channel. Further, in some embodiments, for quadrature implementation, a handshake between ADC I and Q channels may occur.

Embodiments of the disclosure are not limited to a specific RF topology, and it is specifically contemplated by this disclosure that the embodiments may be used with a range of RF topologies. As non-limiting examples, topologies based on IEEE 802.15.4 technical standard such as ZigBee, ISA100.11a, WirelessHART, SNAP, and Thread specifications; lower-power topologies based on Bluetooth Low Energy, ANT, ANT+, low-rate wireless personal area networks; WiFi topologies; and topologies that include, or are backward compatible with, the foregoing, such as based on Bluetooth 5.0.

One of ordinary skill in the art will appreciate that wireless receivers that implement one or more embodiments of the disclosure may be used for communication using unlicensed frequencies including 2.4 Ghz, 3.5 GHz, and 5 GHz, as well as across a variety of frequency spectrums, for example, spectrums allocated for commercial communication services such as very low frequency (about 3 kHz-30 kHz), low frequency (about 30-300 kHz), medium frequency (about 300 kHz-3,000 kHz), and high frequency (about 3 MHz-30 MHz), very high frequency (about 30 MHz-300 MHz), ultra-high frequency (about 300 MHz-3000 MHz), super high frequency (about 3 GHz-30 GHz), and extremely high frequency (about 30 GHz-300 GHz).

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additional non-limiting embodiments of the disclosure include:

Embodiment 1: a device, comprising: an analog module comprising a delta-sigma analog-to-digital converter (ADC), the delta-sigma ADC comprising: a first integrator; a quantizer having an input coupled to an output of the first integrator; a first summing node having an output coupled to an input of the first integrator; a feedforward path from an input of the delta-sigma ADC to a first input of the first summing node; and a first feedback path from an output of the quantizer to a second input of the first summing node; a digital module including a digital filter coupled to an output of the delta-sigma ADC; and a modem coupled to an output of the digital module.

Embodiment 2: the device of Embodiment 1, the delta-sigma ADC further comprising: a second summing node having a first input coupled to the input of the delta-sigma ADC; and a second quantizer having an input coupled to an output of the second summing node and an output coupled to a third input of the first summing node.

Embodiment 3: the device of any of Embodiments 1 and 2, the delta-sigma ADC further comprising a second feedback path from the output of the quantizer to a second input of second summing node.

Embodiment 4: the device of any of Embodiments 1 to 3, wherein the first feedback path and the second feedback path are each characterized by a different coefficient.

Embodiment 5: the device of any of Embodiments 1 to 4, wherein the second summing node is configured to: receive an input signal of the delta-sigma ADC; subtract a signal of the second feedback path from the input signal to generate an output signal; and convey the output signal to the second integrator.

Embodiment 6: the device of any of Embodiments 1 to 5, wherein the first summing node is configured to: receive an input signal from the second integrator; subtract a signal of the first feedback path and a signal of the feedforward path from the input signal to generate an output signal; and convey the output signal to the first integrator.

Embodiment 7: the device of any of Embodiments 1 to 6, further comprising a delay element coupled to a third input of the first summing node.

Embodiment 8: the device of any of Embodiments 1 to 7, further comprising a microcontroller coupled to the modem.

Embodiment 9: an analog-to-digital converter (ADC) comprising a delta-sigma loop filter, the delta-sigma loop filter comprising: a first integrator; a first summing node having a first input coupled to an output of the first integrator; a second integrator having an input coupled to an output of the first summing node; a quantizer having an input coupled to an output of the second integrator; an input-feedforward path from an input of the delta-sigma loop filter to a second input of the first summing node; a first feedback path from an output of the quantizer to a third input of the first summing node; a second summing node having a first input coupled to the input of the delta-sigma loop filter and an output coupled to an input of the first integrator; and a second feedback path from the output of the quantizer to a second input of the second summing node.

Embodiment 10: the ADC of Embodiment 9, wherein the second summing node is configured to generate an output signal based on a signal of the second feedback path and a signal at the input of the delta-sigma loop filter.

Embodiment 11: the ADC of any of Embodiments 9 and 10, wherein the first summing node is configured to generate an output signal based on a signal of the first feedback path, a signal from the first integrator, and a signal of the input-feedforward path.

Embodiment 12: the ADC of any of Embodiments 9 to 11, further comprising a delay element coupled between the first integrator and the first summing node.

Embodiment 13: the ADC of any of Embodiments 9 to 12, wherein the first feedback path includes a digital-to-analog converter (DAC) and the first feedback path is characterized by a first coefficient, and the second feedback path includes a DAC and the second feedback path is characterized by a second, different coefficient.

Embodiment 14: the ADC of any of Embodiments 9 to 13, wherein each of the first feedback path, the second feedback path, and the input-feedforward path include an gain stage coupled to an associated summing node.

Embodiment 15: an analog-to-digital converter (ADC) comprising a delta-sigma loop filter, the delta-sigma loop filter comprising: a first summing node having a first input coupled to an input of the delta-sigma loop filter; a first integrator having an input coupled to an output of the first summing node; a second summing node having a first input coupled to an output of the first integrator; a second integrator having an input coupled to an output of the second summing node; a third summing node having a first input coupled to an output of the second integrator; a third integrator having an input coupled to an output of the third summing node; a quantizer having an input coupled to an output of the third integrator; a first input-feedforward path from the input of the delta-sigma loop filter to a second input of the second summing node; a first feedback path from an output of the quantizer to a second input of the first summing node; and a second feedback path from the output of the quantizer to a third input of the second summing node.

Embodiment 16: the ADC of Embodiment 15, the delta-sigma loop filter further comprising a second input-feedforward path from the input of the delta-sigma loop filter to a second input of the third summing node.

Embodiment 17: the ADC of any of Embodiments 15 and 16, the delta-sigma loop filter further comprising a third input-feedforward path from the input of the delta-sigma loop filter to a third input of the third summing node.

Embodiment 18: the ADC of any of Embodiments 15 to 17, the delta-sigma loop filter further comprising a third feedback path from the output of the quantizer to a fourth input of the third summing node.

Embodiment 19: the ADC of any of Embodiments 15 to 18, wherein the first feedback path, the second feedback path, and the third feedback path are each characterized by a different coefficient.

Embodiment 20: the ADC of any of Embodiments 15 to 19, further comprising a delay element coupled between the output of the second integrator and the first input of third summing node.

Embodiment 21: an analog-to-digital converter (ADC), comprising: a first channel configured to receive an in-phase signal and including a first delta-sigma loop filter; and a second channel configured to receive a quadrature signal and including a second delta-sigma loop filter; each of the first delta-sigma loop filter and the second delta-sigma loop filter comprising: a first integrator; a quantizer having an input coupled to an output of the first integrator; a first summing node having an output coupled to an input of the first integrator; a feedforward path from an input of the delta-sigma loop filter to a first input of the first summing node; and a first feedback path from an output of the quantizer to a second input of the first summing node.

Embodiment 22: the ADC of Embodiment 21, each of the first delta-sigma loop filter and the second delta-sigma loop filter further comprising: a second summing node having a first input coupled to the input of the delta-sigma loop filter; a second integrator having input coupled to an output of the second summing node and an output coupled to a third input of the first summing node; and a second feedback path from the output of the quantizer to a second input of second summing node.

Embodiment 23: the ADC of any of Embodiments 21 and 22, further comprising: a first path coupling an output of the first integrator of the first delta-sigma loop filter to a third input of the second summing node of the second delta-sigma loop filter; a second path coupling an output of the first integrator of the second delta-sigma loop filter to a third input of the second summing node of the first delta-sigma loop filter; a third path coupling an output of the second integrator of the first delta-sigma loop filter to a fourth input of the first summing node of the second delta-sigma loop filter; and a fourth path coupling an output of the second integrator of the second delta-sigma loop filter to a fourth input of the first summing node of the first delta-sigma loop filter.

Embodiment 24: the ADC of any of Embodiments 21 to 23, wherein at least one of the first path, the second path, the third path, the fourth path includes a multiplexer for switching a polarity of a coefficient of an associated path.

Embodiment 25: the ADC of any of Embodiments 21 to 24, wherein: each of the first path, the second path, the third path, and the fourth path include a programmable coefficient; and each of the first path, the second path, the third path, and the fourth path are configured to be in one of an enabled state and a disabled state.

Embodiment 26: the ADC of any of Embodiments 21 to 25, further comprising: a fifth path coupling an output of the first integrator of the first delta-sigma loop filter to a fourth input of the second summing node of the first delta-sigma loop filter; and a sixth path coupling an output of the first integrator of the second delta-sigma loop filter to a third input of the second summing node of the second delta-sigma loop filter.

Embodiment 27: the ADC of any of Embodiments 21 to 26, wherein: each of the fifth path and the sixth path include a programmable coefficient; and each of the fifth path and the sixth path are configured to be in one of an enabled state and a disabled state.

Embodiment 28: the ADC of any of Embodiments 21 to 27, further comprising: a fifth path coupling an input of first delta-sigma loop filter to a fifth input of the first summing node of the second delta-sigma loop filter; and a sixth path coupling an input of second delta-sigma loop filter to a fifth input of the first summing node of the first delta-sigma loop filter.

Embodiment 29: the ADC of any of Embodiments 21 to 28, further comprising: a seventh path coupling an output of the second integrator of first delta-sigma loop filter to a third input of the second summing node of the first delta-sigma loop filter; and an eighth path coupling an output of the first integrator of first delta-sigma loop filter to a sixth input of the first summing node of the first delta-sigma loop filter; a ninth path coupling an output of the second integrator of second delta-sigma loop filter to a third input of the second summing node of the second delta-sigma loop filter; and a tenth path coupling an output of the first integrator of second delta-sigma loop filter to a sixth input of the first summing node of the second delta-sigma loop filter.

Embodiment 30: a device, comprising: an analog module comprising a delta-sigma analog-to-digital converter (ADC), the delta-sigma ADC comprising a plurality of channels, each channel comprising: a first integrator; a first summing node having a first input coupled to the input of the delta-sigma loop filter and an output coupled to an input of the first integrator; a second summing node having a first input coupled to an output of the first integrator; a second integrator having an input coupled to an output of the second summing node; a quantizer having an input coupled to an output of the second integrator; an input-feedforward path from an input of the delta-sigma loop filter to a second input of the second summing node; a first feedback path from an output of the quantizer to a third input of the second summing node; and a second feedback path from the output of the quantizer to a second input of the first summing node; a digital module including a digital filter coupled to an output of the delta-sigma ADC; and a modem coupled to an output of the digital module.

Embodiment 31: the device of Embodiment 30, wherein the first summing node is configured to generate an output signal based on a signal of the second feedback path and a signal at the input of the delta-sigma loop filter.

Embodiment 32: the device of any of Embodiments 30 and 31, wherein the second summing node is configured to generate an output signal based on a signal of the first feedback path, a signal from the first integrator, and a signal of the input-feedforward path.

Embodiment 33: the device of any of Embodiments 30 to 32, further comprising a switched capacitor network coupled to and configured to program the delta-sigma ADC.

Embodiment 34: a quadrature delta-sigma analog-to-digital converter (ADC), comprising: a first channel configured to receive an in-phase signal and a second channel configured to receive a quadrature signal, each of the first channel and the second channel including: a first integrator; a first summing node having a first input coupled to the input of the channel and an output coupled to an input of the first integrator; a second summing node having a first input coupled to an output of the first integrator; a second integrator having an input coupled to an output of the second summing node; a quantizer having an input coupled to an output of the second integrator; an input-feedforward path from an input of the delta-sigma loop filter to a second input of the second summing node; and at least one feedback path coupled from an output of the quantizer to at least one of the first summing node and the second summing node.

Embodiment 35: the quadrature delta-sigma ADC of Embodiment 34, wherein the at least one feedback path comprises: a first feedback path from an output of the quantizer to a third input of the second summing node; and a second feedback path from the output of the quantizer to a second input of the first summing node.

Embodiment 36: the quadrature delta-sigma ADC of any of Embodiments 34 and 35, wherein each of the first channel and the second channel comprise a third feedback path from an output of the second integrator to first summing node.

Embodiment 37: the quadrature delta-sigma ADC of any of Embodiments 34 to 36, wherein the third feedback path comprises a programmable coefficient.

Embodiment 38: the quadrature delta-sigma ADC of any of Embodiments 34 to 37, further comprising a first cross coupling path coupling an output of the first integrator of the first channel to the second summing node of the second channel; a second cross coupling path coupling an output of the first integrator of the second channel to the second summing node of the first channel; a third cross coupling path coupling an output of the second integrator of the first channel to the first summing node of the second channel; and a fourth cross coupling path coupling an output of the second integrator of the second channel to the first summing node of the first channel.

Embodiment 39: the quadrature delta-sigma ADC of any of Embodiments 34 to 38, wherein at least one of the first cross coupling path, the second cross coupling path, the third cross coupling path, and the fourth cross coupling path includes a programmable gain.

Embodiment 40: the quadrature delta-sigma ADC of any of Embodiments 34 to 39, wherein at least one of the first cross coupling path, the second cross coupling path, the third cross coupling path, and the fourth cross coupling path includes a multiplexer for switching a polarity of a coefficient of an associated path.

Embodiment 41: an analog-to-digital converter, comprising: an input configured to receive an analog signal; and first and second selectable channels each comprising delta-sigma loop filters, wherein the first selectable channel is configured to receive an analog signal from the input and the second selectable channel is configured to receive another analog signal 90 degrees out of phase with the analog signal from the input.

Embodiment 42: a circuit, comprising: a first filter circuit configured for a first polarity input signal; a second filter circuit configured for a second polarity input signal; and a cross coupling circuit configured to operatively couple the first filter circuit and the second filter circuit.

Embodiment 43: the circuit of Embodiment 42, wherein the cross coupling circuit is configured to: operatively couple the input of a quantizer of the first filter circuit to an input feedforward path of the second filter circuit, and operatively couple the input of a quantizer of the second filter circuit to an input feedforward path of the first filter circuit.

Embodiment 44: the circuit of any of Embodiments 42 and 43, wherein the cross coupling circuit is configured to: operatively couple the output of an intermediate integrator of the first filter circuit to a summing node at the input of an intermediate integrator of the second filter circuit; and operatively couple the output of an intermediate integrator of the second filter circuit to a summing node at the input of an intermediate integrator of the first filter circuit.

Embodiment 45: the circuit of any of Embodiments 43 to 44, further comprising: a first variable gain path from an input of a quantizer of the first filter circuit to a summing node at an input of an intermediate integrator of the first filter circuit; and a second variable gain path of an input of a quantizer of the second filter circuit to a summing node at an input of an intermediate integrator of the second filter circuit.

Embodiment 46: the circuit of any of Embodiments 42 to 45, wherein a gain of the first variable gain path and a gain of the second variable gain path are configurable.

Embodiment 47: a radio-frequency receiver, comprising: an analog-to-digital converter; and control circuitry operatively coupled to the analog-to-digital converter and configured to change one or more operational characteristics of the analog-to-digital converter responsive to a number of selection circuits.

Embodiment 48: the receiver of Embodiment 47, wherein the control circuitry is a switched capacitor network, and one or more of the number of selection circuits is a capacitor.

Embodiment 49: the receiver of Embodiments 47 and 48, wherein the one or more operational characteristics comprise one or more operational modes and one or more operational parameters.

Embodiment 50: the receiver of any of Embodiments 47 to 49, wherein the one or more operational modes comprise a quadrature mode, a low-pass mode, a low-pass zero optimization mode, and combinations thereof.

Embodiment 51: the receiver of any of Embodiments 47 to 50, wherein the one or more operational parameters include a center-frequency bandwidth of the analog-to-digital converter.

Embodiment 52: the receiver of any of Embodiments 47 to 51, wherein the one or more operational modes comprise a zero-intermediate frequency mode and low-intermediate frequency mode.

Embodiment 53: the receiver of any of Embodiments 47 to 52, further comprising a digital filter operatively coupled to an output of the analog-to-digital converter.

Any characterization in this disclosure of something as 'typical,' 'conventional,' or 'known' does not necessarily mean that it is disclosed in the prior art or that the discussed aspects are appreciated in the prior art. Nor does it necessarily mean that, in the relevant field, it is widely known, well-understood, or routinely used.

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

We claim:

1. A programmable delta-sigma modulator, comprising:
    a first channel configured to receive an in-phase signal and including a first delta-sigma loop filter; and
    a second channel configured to receive a quadrature signal and including a second delta-sigma loop filter;
    each of the first delta-sigma loop filter and the second delta-sigma loop filter comprising:
        a first integrator;
        a quantizer having an input coupled to an output of the first integrator;
        a first summing node having an output coupled to an input of the first integrator;
        a feedforward path from an input of the delta-sigma loop filter to a first input of the first summing node; and
        a first feedback path from an output of the quantizer to a second input of the first summing node; and
    a selection unit for:
        selecting one of the first channel and the second channel responsive to a low-pass mode of operation; and
        selecting the other one of the first channel and the second channel responsive to a quadrature mode of operation.

2. The programmable delta-sigma modulator of claim 1, wherein an encoded signal processed in quadrature mode exhibits two zeroes in the signal band.

3. The programmable delta-sigma modulator of claim 1, wherein an encoded signal processed in low-pass mode exhibits at least one zero in the signal band and at least one zero in the image band.

4. A programmable delta-sigma modulator, comprising:
    a first channel configured to receive an in-phase signal and including a first delta-sigma loop filter; and
    a second channel configured to receive a quadrature signal and including a second delta-sigma loop filter;
    each of the first delta-sigma loop filter and the second delta-sigma loop filter comprising:
        an integrator;
        a quantizer having an input coupled to an output of the integrator;
        a summing node having an output coupled to an input of the integrator;
        a feedforward path from an input of the delta-sigma loop filter to a first input of the summing node; and
        a first feedback path from an output of the quantizer to a second input of the summing node; and
    at least one cross-coupling path between the first delta-sigma loop filter and the second delta-sigma loop filter, the at least one cross-coupling path including one or more programmable coefficients for configuring the programmable delta-sigma modulator in a low-pass mode or a quadrature mode.

5. The programmable delta-sigma modulator of claim 4, wherein each of the first delta-sigma loop filter and the second delta-sigma loop filter further comprises:
an additional summing node having a first input coupled to the input of the delta-sigma loop filter;
an additional integrator having an input coupled to an output of the additional summing node and an output coupled to a third input of the summing node; and
a second feedback path from the output of the quantizer to a second input of additional summing node.

6. The programmable delta-sigma modulator of claim 5, further comprising:
a first path coupling an output of the first integrator of the first delta-sigma loop filter to a third input of the second summing node of the second delta-sigma loop filter;
a second path coupling an output of the first integrator of the second delta-sigma loop filter to a third input of the second summing node of the first delta-sigma loop filter;
a third path coupling an output of the additional integrator of the first delta-sigma loop filter to a fourth input of the additional summing node of the second delta-sigma loop filter; and
a fourth path coupling an output of the additional integrator of the second delta-sigma loop filter to a fourth input of the additional summing node of the first delta-sigma loop filter.

7. The programmable delta-sigma modulator of claim 6, wherein at least one of the first path, the second path, the third path, the fourth path includes a multiplexer for switching a polarity of a coefficient of an associated path.

8. The programmable delta-sigma modulator of claim 6, wherein:
each of the first path, the second path, the third path, and the fourth path include a programmable coefficient; and
each of the first path, the second path, the third path, and the fourth path are configured to be in one of an enabled state and a disabled state.

9. The programmable delta-sigma modulator of claim 6, further comprising:
a fifth path coupling an output of the integrator of the first delta-sigma loop filter to a fifth input of the summing node of the first delta-sigma loop filter; and
a sixth path coupling an output of the integrator of the second delta-sigma loop filter to a fifth input of the summing node of the second delta-sigma loop filter.

10. The programmable delta-sigma modulator of claim 9, wherein:
each of the fifth path and the sixth path include a programmable coefficient; and
each of the fifth path and the sixth path are configured to be in one of an enabled state and a disabled state.

11. The programmable delta-sigma modulator of claim 6, further comprising:
a fifth path coupling an input of first delta-sigma loop filter to a fifth input of the summing node of the second delta-sigma loop filter; and
a sixth path coupling an input of second delta-sigma loop filter to a fifth input of the summing node of the first delta-sigma loop filter.

12. The programmable delta-sigma modulator of claim 11, further comprising:

a seventh path coupling an output of the additional integrator of first delta-sigma loop filter to a fourth input of the additional summing node of the first delta-sigma loop filter;
an eighth path coupling an output of the integrator of first delta-sigma loop filter to a sixth input of the summing node of the first delta-sigma loop filter;
a ninth path coupling an output of the additional integrator of second delta-sigma loop filter to a fourth input of the additional summing node of the second delta-sigma loop filter; and
a tenth path coupling an output of the integrator of second delta-sigma loop filter to a sixth input of the summing node of the second delta-sigma loop filter.

13. A programmable receiver, comprising:
an analog module comprising a programmable delta-sigma analog-to-digital converter (ADC), the delta-sigma ADC comprising:
first and second channels, each of the first and second channels including a loop filter;
at least one first cross coupling path coupling the first channel to the second channel; and
at least one second cross coupling path coupling the second channel to the first channel, each of the at least one first cross coupling path and the at least one second cross coupling path including a programmable coefficient and a multiplexer for switching a polarity of the programmable coefficient; and
a digital module including a digital filter coupled to an output of the delta-sigma ADC.

14. The programmable receiver of claim 13, wherein each of the first channel and the second channel include:
a first integrator;
a first summing node having a first input coupled to an input of the channel and an output coupled to an input of the first integrator;
a second summing node having a first input coupled to an output of the first integrator;
a second integrator having an input coupled to an output of the second summing node;
a quantizer having an input coupled to an output of the second integrator;
an input-feedforward path from the input of the channel to a second input of the second summing node;
a first feedback path from an output of the quantizer to a third input of the second summing node; and
a second feedback path from the output of the quantizer to a second input of the first summing node.

15. The programmable receiver of claim 14, wherein the first summing node is configured to generate an output signal based on a signal of the second feedback path and a signal at the input of the channel, and the second summing node is configured to generate an output signal based on a signal of the first feedback path, a signal from the first integrator, and a signal of the input-feedforward path.

16. The programmable receiver of claim 13, further comprising a switched capacitor network coupled to and configured to program the delta-sigma ADC.

17. A quadrature delta-sigma analog-to-digital converter (ADC), comprising:
a first channel configured to receive an in-phase signal and a second channel configured to receive a quadrature signal, each of the first channel and the second channel including:
- a first integrator;
- a first summing node having a first input coupled to an input of the channel and an output coupled to an input of the first integrator;
- a second summing node having a first input coupled to an output of the first integrator;
- a second integrator having an input coupled to an output of the second summing node;
- a quantizer having an input coupled to an output of the second integrator;
- an input-feedforward path from the input of the channel to a second input of the second summing node; and
- at least one feedback path coupled from an output of the quantizer to at least one of the first summing node and the second summing node; and
- at least one additional feedback path coupled from an output of the second integrator to the first summing node and including a programmable coefficient.

18. The quadrature delta-sigma ADC of claim 17, wherein the at least one feedback path comprises:
- a first feedback path from an output of the quantizer to a third input of the second summing node; and
- a second feedback path from the output of the quantizer to a second input of the first summing node.

19. The quadrature delta-sigma ADC of claim 18, wherein the at least one additional feedback path comprises a third feedback path from an output of the second integrator to first summing node, wherein the third feedback path comprises the programmable coefficient for configuring a gain of the associated channel.

20. The quadrature delta-sigma ADC of claim 17, further comprising:
- a first cross coupling path coupling an output of the first integrator of the first channel to the first summing node of the second channel;
- a second cross coupling path coupling an output of the first integrator of the second channel to the first summing node of the first channel;
- a third cross coupling path coupling an output of the second integrator of the first channel to the second summing node of the second channel; and
- a fourth cross coupling path coupling an output of the second integrator of the second channel to the second summing node of the first channel.

21. The quadrature delta-sigma ADC of claim 20, wherein at least one of the first cross coupling path, the second cross coupling path, the third cross coupling path, and the fourth cross coupling path includes a programmable gain.

22. The quadrature delta-sigma ADC of claim 20, wherein at least one of the first cross coupling path, the second cross coupling path, the third cross coupling path, and the fourth cross coupling path includes a multiplexer for switching a polarity of a coefficient of an associated path.

* * * * *

UNITED STATES PATENT AND TRADEMARK OFFICE
CERTIFICATE OF CORRECTION

PATENT NO. : 10,756,751 B2
APPLICATION NO. : 16/176714
DATED : August 25, 2020
INVENTOR(S) : Rajaee et al.

It is certified that error appears in the above-identified patent and that said Letters Patent is hereby corrected as shown below:

In the Specification
Column 5, Line 11, change "may be z'." to --may be $z^{-2}$.--

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*